US012744536B2

(12) United States Patent
Kim et al.

(10) Patent No.: US 12,744,536 B2
(45) Date of Patent: Sep. 22, 2026

(54) SYSTEMS, METHODS, AND APPARATUS FOR CONTROLLING OSCILLATOR FREQUENCY RESPONSE

(71) Applicant: Samsung Electronics Co., Ltd., Suwon-si (KR)

(72) Inventors: Jaehyup Kim, San Jose, CA (US); Joung Won Park, San Diego, CA (US); Dae Hyun Kang, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 18/764,126

(22) Filed: Jul. 3, 2024

(65) Prior Publication Data

US 2025/0202491 A1 Jun. 19, 2025

Related U.S. Application Data

(60) Provisional application No. 63/609,844, filed on Dec. 13, 2023.

(51) Int. Cl.

| | |
|---|---|
| ***H03L 7/099*** | (2006.01) |
| ***H03K 3/03*** | (2006.01) |
| ***H03L 7/093*** | (2006.01) |

(52) U.S. Cl.

CPC ........... *H03L 7/099* (2013.01); *H03K 3/0315* (2013.01); *H03L 7/093* (2013.01); *H03L 7/0995* (2013.01)

(58) Field of Classification Search

CPC ...... H03L 7/0995; H03L 7/093; H03K 3/0315

See application file for complete search history.

(56) References Cited

U.S. PATENT DOCUMENTS

| | | | |
|---|---|---|---|
| 7,167,056 | B2 | 1/2007 | Fang et al. |
| 7,609,118 | B1 | 10/2009 | Groe et al. |
| 8,248,121 | B2 | 8/2012 | Lee |
| 8,552,772 | B2 | 10/2013 | Jovenin |
| 10,333,530 | B1 | 6/2019 | Katsuragi |
| 10,763,783 | B2 | 9/2020 | Heschl et al. |

(Continued)

OTHER PUBLICATIONS

European Extended Search Report for Application No. 24217445.6, mailed May 16, 2025.

(Continued)

*Primary Examiner* — Ryan Johnson

(74) *Attorney, Agent, or Firm* — Renaissance IP Law Group LLP

(57) ABSTRACT

A method may include generating, using an oscillator, a first signal having a frequency based on a current, generating, based on a second signal, a first portion of the current, the first portion of the current having a first frequency characteristic, and generating, based on the second signal, a second portion of the current, the second portion of the current having a second frequency characteristic. A gain of the first frequency characteristic may change based on a frequency of the second signal. The first frequency characteristic may include a first gain at a first frequency, and a second gain at a second frequency. The first gain may be greater than the second gain, and the second frequency may be greater than the first frequency. A phase of the first frequency characteristic may change based on a frequency of the second signal.

16 Claims, 24 Drawing Sheets

(56) References Cited

U.S. PATENT DOCUMENTS

| | | | | |
|---|---|---|---|---|
| 11,870,450 | B1 * | 1/2024 | Cheng | H03L 7/0995 |
| 2004/0169563 | A1 | 9/2004 | Abbasi et al. | |
| 2007/0030079 | A1 * | 2/2007 | Kawamoto | H03L 7/0995 331/16 |
| 2013/0027098 | A1 | 1/2013 | Wang et al. | |
| 2020/0336150 | A1 | 10/2020 | Tsai et al. | |
| 2025/0096808 | A1 * | 3/2025 | Wu | H03L 7/0995 |

OTHER PUBLICATIONS

Fischette, Dennis, "First Time, Every Time—Practical Tips for Phase Phase-Locked Loop Design," 2007, 120 pages.
Long, S., "Phase Locked Loop Circuits," UCSB/ECE Department, 2005, 46 pages.
Mansukhani, Arun, "Phase Lock Loop Stability Analysis," Applied Microwave & Wireless, 2000, 5 pages.
Massachusetts Institute of Technology Department of Mechanical Engineering, "Understanding Poles and Zeros," 2.14 Analysis and Design of Feedback Control Systems, 2002, 13 pages.
Niknejad, A., "Lecture 12: MOS Transistor Models," EECS 105 Fall 2003, Lecture 12, Department of EECS, 2003, 34 pages.
Palermo, Sam, "ECEN620: Network Theory Broadband Circuit Design Fall 2012," Lecture 6: PLL Stability, 2012, 23 pages.
Razavi, Behzad et al., "Design of Monolithic Phase-Locked Loops and Clock Recovery Circuits—A Tutorial," Monolithic Phase-Locked Loops and Clock Recovery Circuits: Theory and Design, IEEE, 1996, pp. 1-39.
Renesas Electronics, "PLL Loop Filter Design and Fine Tuning," Application Note, Feb. 2023, 18 pages.

* cited by examiner 720
713
714
715
704
$\Phi_{ref}(s)$
$\Phi_e(s)$
$\frac{1}{2\pi}$
$I_{cp}$
$Z(s)$
$\frac{2\pi K_{vco}}{s}$
$\Phi_{div}(s)$
712
$\frac{1}{N_{DIV}}$
$\Phi_{vco}(s)$

SYSTEMS, METHODS, AND APPARATUS FOR CONTROLLING OSCILLATOR FREQUENCY RESPONSE

REFERENCE TO RELATED APPLICATION

This application claims priority to, and the benefit of, U.S. Provisional Patent Application Ser. No. 63/609,844 filed Dec. 13, 2023 which is incorporated by reference.

TECHNICAL FIELD

This disclosure relates generally to oscillators, and more specifically to systems, methods, and apparatus for controlling oscillator frequency response.

BACKGROUND

An oscillator may generate an output signal at a frequency determined by a control signal. For example, a voltage controlled oscillator (VCO) may generate an output signal that may oscillate at a frequency determined by an input voltage signal. VCOs may be used in various applications such as signal modulation, phase locked loops (PLLs), and/or the like.

The above information disclosed in this Background section is only for enhancement of understanding of the background of the inventive principles and therefore it may contain information that does not constitute prior art.

SUMMARY

A method may include generating, using an oscillator, a first signal having a frequency based on a current, generating, based on a second signal, a first portion of the current, the first portion of the current having a first frequency characteristic, and generating, based on the second signal, a second portion of the current, the second portion of the current having a second frequency characteristic. A gain of the first frequency characteristic may change based on a frequency of the second signal. The method may further include controlling a frequency of the second signal, and controlling, based on the frequency of the second signal, a gain of the first frequency characteristic. The first frequency characteristic may include a first gain at a first frequency, and a second gain at a second frequency. The first gain may be greater than the second gain, and the second frequency may be greater than the first frequency. A phase of the first frequency characteristic may change based on a frequency of the second signal. The method may further include controlling a phase of the second signal, and controlling, based on the phase of the second signal, a gain of the first frequency characteristic. The first frequency characteristic may include a first phase shift at a first frequency, and a second phase shift at a second frequency. The first phase shift may be in a first direction, and the second phase shift may be in a second direction.

A circuit may include an oscillator configured to generate a first signal having a frequency based on a current, and a current generator configured to generate the current, wherein the current generator may include a first path configured to generate, based on a second signal, a first portion of the current, the first path having a first frequency characteristic, and a second path configured to generate, based on the second signal, a second portion of the current, the second path having a second frequency characteristic. The first path may include a first transistor configured to generate, based on the second signal, the first portion of the current, and the second path may include a second transistor configured to generate, based on the second signal, the second portion of the current. The second path may include a filter configured to control, based on the second signal, the second transistor. The current generator may include a third transistor configured to control, based on the second signal, the first transistor and the second transistor. The first path may be configured to generate, based on a third signal, the first portion of the current, the second path may be configured to generate, based on the third signal, the second portion of the current, and the circuit may include an input stage configured to generate, based on the second signal, the third signal. The current may be a first current, the third signal may be a second current, and the current generator may include a current mirror configured to generate, based on the second current, using the first path, the first portion of the first current, and generate, based on the second current, using the second path, the second portion of the first current. The input stage may be configured to generate, based on a comparison of the second signal and a fourth signal, the third signal. The circuit may include a detector circuit configured to generate, based on a comparison of the first signal and a third signal, the second signal. The circuit may have a loop bandwidth, the first path may have a pole at a pole frequency, and the loop bandwidth may be greater than the pole frequency.

A circuit may include an oscillator configured to generate a first signal having a frequency based on a current, a current generator configured generate the current, and an input stage configured to control the current generator based on a comparison of a second signal and a third signal. The second signal may include an input signal, and the third signal may include a reference signal. The input stage may include a first transistor comprising a first terminal connected to a power supply, a second terminal configured to receive the second signal, and a third terminal connected to the current generator, and a second transistor comprising a first terminal connected to the power supply, a second terminal configured to receive the third signal, and a third terminal connected to the current generator. The second terminal of the first transistor may be connected, using a first current source, to the power supply, the second terminal of the second transistor may be connected, using a second current source, to the power supply, and the input stage may include a resistor connected between the first transistor and the second transistor.

A circuit may include an oscillator configured to generate an output signal having a frequency based on a first signal, and a signal generator configured to generate the first signal, wherein the signal generator may include a first path configured to generate a first portion of the first signal based on a second signal, the first path having a first frequency characteristic, and a second path configured to generate a second portion of the first signal based on the second signal, the second path having a second frequency characteristic.

A circuit may include an oscillator configured to generate an output signal having a frequency based on a control signal, and an input stage configured to generate the control signal based on a comparison of an input signal and a reference signal.

BRIEF DESCRIPTION OF THE DRAWINGS

The figures are not necessarily drawn to scale and elements of similar structures or functions or portions thereof may generally be represented by reference indicators ending in, and/or containing, the same digits, letters, and/or the like, for illustrative purposes throughout the figures. The figures are only intended to facilitate the description of the various embodiments described herein. The figures do not describe every aspect of the teachings disclosed herein and do not limit the scope of the claims. To prevent the drawings from becoming obscured, not all of the components, connections, and the like may be shown, and not all of the components may have reference numbers. However, patterns of component configurations may be readily apparent from the drawings. The accompanying drawings, together with the specification, illustrate example embodiments of the present disclosure, and, together with the description, serve to explain the principles of the present disclosure.

DETAILED DESCRIPTION

Figure 1:
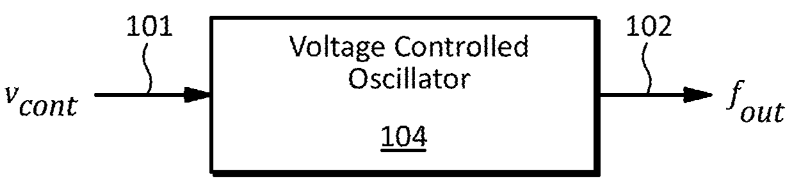
FIG. 1 illustrates an embodiment of a voltage controlled oscillator in accordance with example embodiments of the disclosure.

An oscillator such as a voltage controlled oscillator (VCO) may generate an oscillating signal at a frequency determined by an input voltage signal applied to the VCO. A VCO may be used, for example, in a phase locked loop (PLL) to generate an output signal at a frequency that may be a multiple of the frequency of a reference signal. The dynamics (e.g., frequency response) of a VCO may affect the stability, capture range, lock range, and/or other performance characteristics of a PLL in which it may be used.

One type of VCO may include a voltage-to-current converter, a current mirror, and a current controlled oscillator. The voltage-to-current converter may convert an input voltage to a first current that may be applied to the current mirror. The current mirror may generate a second current at a multiple of the first current. For example, the current mirror may have a 1:N current ratio such that the second current is N times the first current. The second current may be applied to the current controlled oscillator (e.g., a ring oscillator) which may oscillate at a frequency based on the second current.

In some embodiments, a relatively high current multiplication ratio may provide the VCO with a relatively high gain coefficient ($K_{VCO}$) which may enable the VCO (and/or a PLL in which the VCO may be used) to operate over a relatively wide frequency range. A potential problem with a high current multiplication ratio, however, is that noise associated with the current mirror may increase as the multiplication ratio increases. Depending on the implementation details, the noise may limit the amount of useable current multiplication, gain coefficient, and/or frequency range. Another potential problem with a high current multiplication ratio, gain coefficient, and/or the like, is that it may change the dynamics of the VCO in a manner that may reduce the stability of a PLL in which it is used.

An oscillator (e.g., a VCO) in accordance with example embodiments of the disclosure may include a current generator (e.g., a current mirror) that may generate a current with two or more components having different frequency characteristics. For example, a current mirror may include a relatively high frequency current path that may provide a current component having relatively large variations based on variations in a control signal (e.g., an input voltage). The current mirror may also include a relatively low frequency current path that may provide a current component having relatively small variations based on variations in the control signal. The two components may be combined (e.g., by summing), and the combined current may be applied to a current controlled oscillator. The use of a current having components with different frequency characteristics may reduce or eliminate noise problems associated with a current mirror, which, depending on the implementation details, may increase the usable current multiplication ratio, gain coefficient, frequency range, and/or the like, of a VCO and/or a PLL. Additionally, or alternatively, the use of a current having components with different frequency characteristics may reduce or eliminate stability problems associated with a relatively high current multiplication ratio, gain coefficient, and/or the like.

In some applications, a VCO may be used in a PLL having a loop filter with a charge pump that may output a positive current (also referred to as an up current or $I_{UP}$) or a negative current (also referred to as a down current or $I_{DN}$) based on the output of a phase-frequency detector (PFD) in the PLL. The output currents of the charge pump may be applied to the loop filter which may generate a control voltage (which may be referred to as $V_{cont}$) that may be applied as the input signal to the VCO. The control voltage may settle at a value when the PLL is locked.

A potential problem with a charge pump PLL is that the relative magnitudes of the positive and negative charge pump currents may not be equal, especially under certain operating conditions (e.g., process, voltage, and/or temperature (PVT) conditions, operating frequency, and/or the like). For example, in some embodiments, the positive and negative charge pump currents may be equal (e.g., matched) when the voltage across a loop filter being driven by the charge pump settles to a value about halfway (also referred to as a midpoint) between positive and negative power supply voltages (e.g., $V_{DD}$ and ground). As the voltage across the loop filter moves away from the midpoint (e.g., away from $V_{DD}/2$), a mismatch may develop such that the positive and negative charge pump currents may become unequal. Depending on the implementation details, mismatched charge pump currents may cause spurs, jitter, phase noise, and/or the like in a PLL.

Moreover, some VCOs may include voltage-to-current converters that may be constructed in a manner that may cause the voltage across a loop filter to operate or settle at a voltage other than the midpoint, thereby causing a mismatch in the positive and negative charge pump currents. For example, some voltage-to-current converters may have a voltage-to-current conversion ratio that varies with changes in the threshold voltage of an input transistor (which may be sensitive to PVT values), the value of a degeneration resistor used for the input transistor, and/or the like.

An oscillator (e.g., a VCO) in accordance with example embodiments of the disclosure may include an input stage (e.g., a voltage-to-current converter) that may cause an input signal of the oscillator (e.g., $V_{cont}$ of a VCO) to operate at or near a midpoint of a power supply voltage or other value at which a charge pump may generate matched positive and negative currents. For example, an input stage may be implemented with a voltage-to-current converter having a pair of differential inputs (e.g., a differential input transconductance stage which may be referred to as a $G_m$ of $g_m$ stage). One of the differential inputs may be connected to receive the input signal of the oscillator (e.g., $V_{cont}$), and the other differential input may be connected to a reference signal (e.g., a midpoint or $V_{DD}/2$). Thus, the voltage-to-current converter may operate based on the difference between the input signal and a reference signal (e.g., by comparing the input signal to a reference signal). Depending on the implementation details, this may cause the input control signal for the oscillator to settle at a value at which a charge pump may generate matched positive and negative currents when a PLL in which the VCO is used is locked. Additionally. or alternatively, depending on the implementation details, the use of a differential input stage for an oscillator may reduce or eliminate the sensitivity of the input stage to transistor threshold voltages, degeneration resistor values, operating temperature, and/or the like. Additionally, or alternatively, depending on the implementation details, the use of a differential input stage for an oscillator may reduce or eliminate the need for one or more types of calibration (e.g., PVT calibration) of the oscillator.

This disclosure encompasses numerous aspects relating to oscillators such as input stages, current generators, and/or the like. The aspects disclosed herein may have independent utility and may be embodied individually, and not every embodiment may utilize every aspect. Moreover, the aspects may also be embodied in various combinations, some of which may amplify some benefits of the individual aspects in a synergistic manner.

For purposes of illustration, some embodiments may be described in the context of some specific implementation details such as devices implemented with specific types of transistors, filters, charge pumps, oscillators, current mirrors, numbers and/or configurations of components, and/or the like. However, the aspects of the disclosure are not limited to these or any other implementation details.

FIG. 1 illustrates an embodiment of a voltage controlled oscillator in accordance with example embodiments of the disclosure. The voltage controlled oscillator (VCO) 104 illustrated in FIG. 1 may generate an oscillating output signal 102 having a frequency $f_{out}$ that may be determined by the value of a control voltage $v_{cont}$ applied as an input 101 to the VCO 104.

In some embodiments throughout this disclosure, and depending on the context, certain indicia may be used to indicate a signal, an aspect of the signal (e.g., a frequency, voltage, and/or the like of the signal), a terminal that may carry the signal, a component, a value of the component, and/or the like. For example, depending on the context, $f_{out}$ may indicate the output signal 102, the frequency of the output signal 102, and/or an output terminal that may carry the output signal 102 from the VCO 104. As another example, depending on the context, $v_{cont}$ may indicate the input signal 101, the value of a control voltage applied as the input signal 101, and/or an input terminal that may carry the input signal 101 to the VCO 104. As a further example, depending on the context. R or C may indicate a resistor or a capacitor, respectively, and/or a value of a resistor or a capacitor, respectively.

Figure 2:
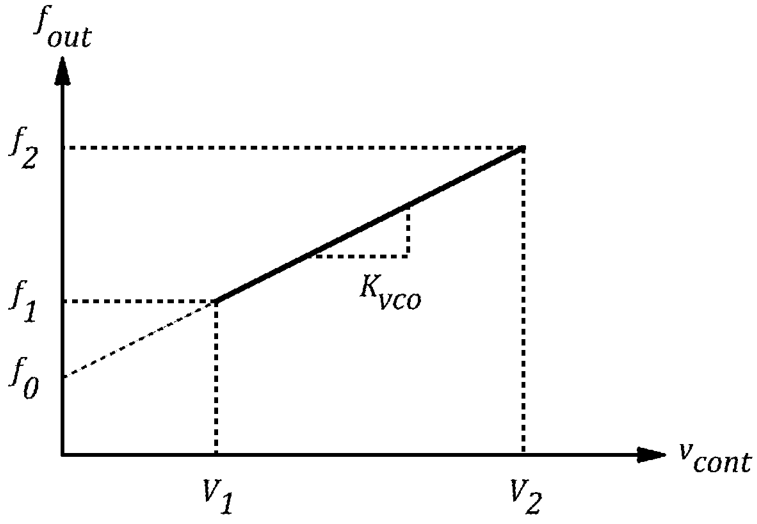
FIG. 2 illustrates a graph of an example frequency characteristic of the voltage controlled oscillator illustrated in FIG. 1 in accordance with example embodiments of the disclosure.

FIG. 2 illustrates a graph of an example frequency characteristic of the voltage controlled oscillator illustrated in FIG. 1 in accordance with example embodiments of the disclosure. Referring to FIG. 2, in some embodiments, the frequency $f_{out}$ of the output signal illustrated along the vertical axis may vary in proportion to the magnitude of the control voltage $v_{cont}$ illustrated along the horizontal axis. For example, the value of $f_{out}$ may be $f_1$ at a control voltage of $V_1$ and $f_2$ at a control voltage of $V_2$. The slope of the frequency characteristic illustrated in FIG. 2 may represent a gain coefficient $K_{VCO}$ (which may also be referred to as the gain) of the VCO 104. For example, in the embodiment illustrated in FIG. 2, $K_{VCO}$ may be determined as follows:

$$K_{VCO} = \frac{\Delta f \text{ (frequency variation)}}{\Delta V \text{ (voltage variation)}} = \frac{f_2 - f_1}{V_2 - V_1} \quad \text{(Eq. 1)}$$

which may be expressed, for example, in units of Hertz/Volt (Hz/V).

The value $f_0$ may indicate an offset of $K_{VCO}$ for $v_{cont}=0$, and thus $$f_{out} = f_0 + K_{VCO} v_{cont}. \quad \text{(Eq. 2)}$$

The phase $\phi_{out}$ of the output signal 102 may be represented in the time domain as follows:

$$\phi_{out}(t) = \int \omega_{out} dt = 2\pi \int f_{out} dt = 2\pi f_0 t + 2\pi K_{VCO} \int v_{cont} dt \quad \text{(Eq. 3)}$$

where $\omega_{out}$ may represent the frequency of the output signal in radians/second such that $\omega_{out}=2\pi f_{out}$. The voltage $v_{out}$ of the output signal 102 may be represented in the time domain as follows:

$$v_{out}(t) = V_0 \cos \theta_{out}(t) = V_0 \cos\left(\int \omega_{out} dt\right) = V_0 \cos 2\pi f_0 t + 2\pi K_{VCO} \int v_{cont} dt. \quad \text{(Eq. 4)}$$

The phase $\phi_{out}$ of the output signal 102 in the time domain may be related to the excess phase $\Phi_{excess}$ in the complex frequency domain (e.g., the s-domain) of the output signal 102 as follows:

$$\phi_{out}(t) \rightarrow \Phi_{excess}(s) = \frac{2\pi K_{VCO}}{s} V_{cont}(s). \quad \text{(Eq. 5)}$$

Figure 3:
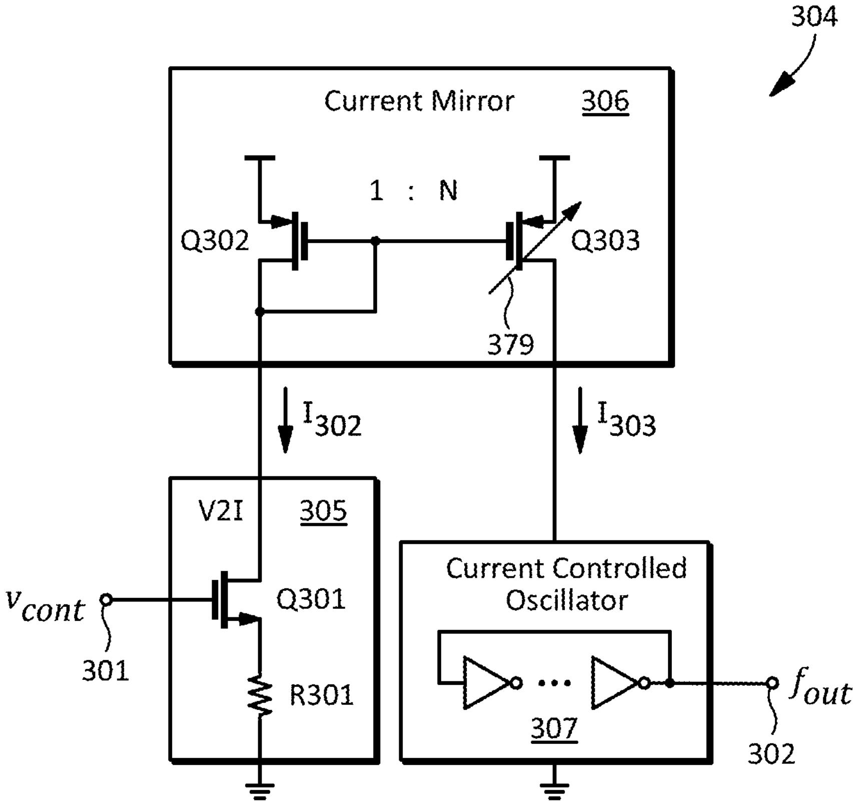
FIG. 3 illustrates an embodiment of a voltage controlled oscillator having a current mirror in accordance with example embodiments of the disclosure.

FIG. 3 illustrates an embodiment of a voltage controlled oscillator having a current mirror in accordance with example embodiments of the disclosure. The VCO 304 illustrated in FIG. 3 may include a voltage-to-current (V2I) converter input stage 305, a current mirror 306, and/or a current controlled oscillator (CCO) 307. The input stage 305 may include a transistor Q301 having a gate configured to receive an input signal at input terminal 301 in the form of a control voltage $v_{cont}$, a source connected to a first power supply (e.g., a ground node) through a degeneration resistor R301, and a drain configured to control a first current $I_{302}$ based on the control voltage $v_{cont}$. Thus, the input stage 305 may have a transconductance $G_m$ that may determine a voltage-to-current conversion ratio of the input stage 305.

The first current $I_{302}$ may function as an input signal to the current mirror 306 which may include transistors Q302 and Q303. Transistor Q302 may have a source connected to a second power supply (e.g., positive power supply node or $V_{DD}$), a drain configured to enable the first current $I_{302}$ to flow into the drain of Q301, and a gate connected back to the drain (e.g., a diode connection). Transistor Q303 may have a source connected to the second power supply, a gate connected to the gate of Q302, and a drain configured to generate a second current $I_{303}$ as an output of the current mirror 306.

The second current $I_{303}$ may function as an input signal to the current controlled oscillator 307 which may be implemented, for example, with a ring oscillator (e.g., a delay chain) having multiple stages (e.g., an odd number of inverter stages) arranged in a ring to generate an oscillating output signal having a frequency $f_{out}$ at an output terminal 302. The frequency $f_{out}$ of the output signal may vary, for example, in proportion to the value of the second current $I_{303}$. Thus, depending on the implementation details, the output frequency $f_{out}$ may vary in proportion to the value of the control voltage $v_{cont}$. In such an implementation, the second current $I_{303}$ may be referred to as $I_{VCO}$, and a gain coefficient $K_{ICO}$ for the current controlled oscillator 307 may be determined as follows:

$$K_{ICO} = \frac{\Delta f_{out} \text{ (frequency variation)}}{\Delta I \text{ (current variation)}} \quad \text{(Eq. 6)}$$

which may be expressed, for example, in units of Hertz/Amp (Hz/A).

Transistors Q302 and Q303 may be configured to provide current multiplication, for example, in a ratio of 1:N such that the output current $I_{303}$ may have a value N times the input current $I_{302}$. In some embodiments, the value of N may be any real positive number, and values greater than one may provide current gain. The current ratio may be implemented, for example, by fabricating transistors Q302 and Q303 with 1:N device geometry ratios (e.g., ratios of channel area, channel width, channel length, and/or the like), and/or by using N parallel copies of Q303, each copy having the same geometry as Q302. Additionally, or alternatively, the current multiplication ratio 1:N may be implemented with an adjustable value of N (as shown by arrow 379) by using one or more switches to selectively connect N copies of Q303 in parallel.

Depending on the implementation details, the VCO 304 illustrated in FIG. 3 may provide a relatively high gain coefficient $K_{VCO}$. Accordingly, a PLL that includes the VCO 304 may cover a relatively wide range of frequencies. For example, using a relatively high value of N may enable the current mirror 306 to generate a relatively high current $I_{303}$ to drive the current controlled oscillator 307 while saving power by maintaining a relatively low current (e.g., $I_{302}=I_{303}/N$) through Q302 and/or Q301. A value of N may be determined, for example, based on one or more of an operating frequency of the current mirror 306, a gain coefficient of the VCO 304 (e.g., $K_{VCO}$), a gain of the voltage-to-current converter 305, and/or the like. Moreover, in some embodiments of low voltage circuits, using a relatively high $K_{VCO}$ may be beneficial.

A potential problem with the embodiment illustrated in FIG. 3, however, is that the current multiplication provided by the value of N may also increase noise (e.g., noise sensitivity may increase). For example, in some embodiments, transistor Q302 may be a dominant source of noise. Depending on the implementation details, the noise caused by Q302 may increase by a factor of $N^2$ in transistor Q303. Increasing $K_{VCO}$ by increasing N may therefore cause an unacceptable increase in phase noise and/or jitter in the output signal $f_{out}$. Thus, the value of N may be limited to a relatively low value in a practical implementation.

Another potential problem with the embodiment illustrated in FIG. 3 is that the voltage-to-current conversion ratio (e.g., $G_m$) of the input stage 305 may depend on the resistance of R301. A further potential problem is that the voltage of the input signal $v_{cont}$ received at the gate of Q301 (e.g., a settled value of $v_{cont}$ when a PLL is locked) may also depend on the value of R301, as well as the threshold voltage of Q301 and/or other PVT values. The settled voltage of the input signal $v_{cont}$ may be especially problematic because, as mentioned above, it may cause a charge pump to operate at an output voltage at which the positive and negative charge pump currents may be mismatched, thereby causing additional spurs, jitter, phase noise, and/or the like in a PLL. Any or all of these potential problems may also reduce the flexibility of the input stage 305 by limiting the values and/or other parameters that may be chosen for the various components.

Figure 4:
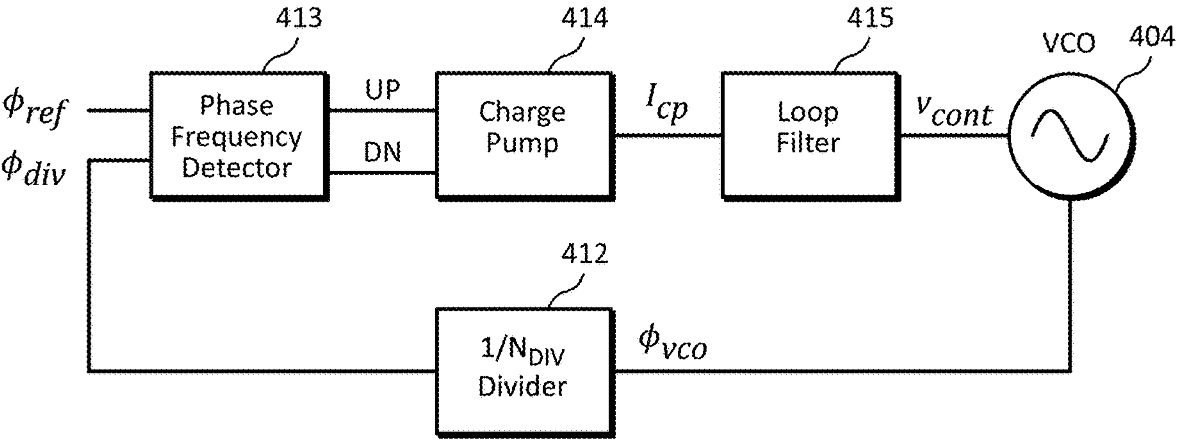
FIG. 4 illustrates an embodiment of a phase locked loop in accordance with example embodiments of the disclosure.

FIG. 4 illustrates an embodiment of a phase locked loop in accordance with example embodiments of the disclosure. The embodiment illustrated in FIG. 4 may include a VCO 404, a frequency divider 412, a phase frequency detector (PFD) 413, a charge pump (CP) 414, and/or a loop filter (LF) 415.

The VCO 404 may be implemented, for example, with any of the VCOs disclosed herein. The frequency divider 412 may generate a feedback signal having a phase $\phi_{div}$ that may be related to the phase $\phi_{VCO}$ of the output of the VCO 404 by $\phi_{div}=\phi_{VCO}/N_{DIV}$ where the frequency divider 412 may implement a divide by $N_{DIV}$ operation. The phase frequency detector 413 may generate an up signal UP and a down signal DN in response to a phase and/or frequency difference between the feedback signal $\phi_{div}$ and a reference signal Pref. For example, the phase frequency detector 413 may generate UP and DN as pulsed digital signals having pulse widths that may be proportional to a phase error between $\phi_{div}$ and $\phi_{ref}$.

The charge pump 414 may generate a charge pump current $I_{cp}$ that may be applied to the loop filter 415. The charge pump current $I_{cp}$ may be a positive (source) current having a specific magnitude during a pulse in the UP signal and a negative (sink) current having the same or similar magnitude during a pulse in the DN signal from the phase frequency detector 413. The loop filter 415 may integrate or otherwise process the positive and/or negative current pulses in the charge pump current $I_{cp}$ to generate the control signal $v_{cont}$ which may be applied as the input to the VCO 404.

Figure 5:
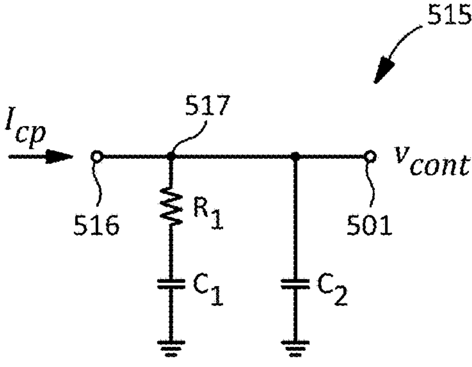
FIG. 5 illustrates an example embodiment of a loop filter in accordance with example embodiments of the disclosure.

FIG. 5 illustrates an example embodiment of a loop filter in accordance with example embodiments of the disclosure. The embodiment illustrated in FIG. 5 may be used, for example, with any of the PLLs, VCOs, and/or the like, disclosed herein. For example, the embodiment illustrated in FIG. 5 may be used to implement the loop filter 415 illustrated in FIG. 4. The loop filter 515 may receive the charge pump current $I_{cp}$ at an input terminal 516 and output a control signal $v_{cont}$ at an output terminal 501. In this example, the input terminal 516 may be connected to the output terminal 501 at a node 517, but in other embodiments, one or more components may be connected between the input terminal 516 and the output terminal 501.

The loop filter 515 may include a first capacitor $C_1$, a resistor $R_1$, and/or a second capacitor $C_2$. The first capacitor $C_1$ may have a first terminal connected to a first power supply (e.g., ground or GND) and a second terminal connected to the node 517 through the resistor $R_1$. The second capacitor $C_2$ may have a first terminal connected to the first power supply (e.g., GND) and a second terminal connected to the node 517. A transfer function of the loop filter 515 may be expressed in various forms. For example, the transfer function (which may be referred to as $v_{cont}/I_{cp}(s)$ or Z(s)) may be expressed in terms of one or more poles and/or zeros in the complex frequency domain (e.g., s-domain) as follows:

$$\frac{v_{cont}}{I_{cp}}(s) = Z(s) = \frac{1 + s \cdot T_1}{s \cdot A_1(1 + s \cdot T_2)} \quad \text{(Eq. 7a)}$$

where $T_1$ may represent a zero, $T_2$ may represent a pole, and the transfer function may include an additional pole at the origin (e.g., s=0).

As another example, the transfer function may be expressed in terms of the values of $R_1$, $C_1$, and $C_2$ as follows:

$$\frac{v_{cont}}{I_{cp}}(s) = Z(s) = \frac{1 + s \cdot C_1 \cdot R_1}{s \cdot (C_1 + C_2)\left(1 + s \cdot \frac{C_1 \cdot C_2}{C_1 + C_2} R_1\right)}. \quad \text{(Eq. 7b)}$$

As a further example, the transfer function may be expressed in terms of zero and pole frequencies as follows:

$$\frac{v_{cont}}{I_{cp}}(s) = Z(s) = \frac{Z_{dc}\left(1 + \frac{s}{\omega_z}\right)}{s\left(1 + \frac{s}{\omega_p}\right)} \quad \text{(Eq. 7c)}$$

where $Z_{dc}$ may represent a DC impedance, $\omega_z$ may represent the frequency of a zero, $\omega_p$ may represent the frequency of a pole, and the additional s in the denominator may represent an additional pole at the origin (e.g., s=0).

In some embodiments, the first capacitor $C_1$ may integrate (e.g., average) the charge pump current $I_{cp}$. However, $C_1$ may introduce a pole (e.g., at the origin) which may cause instability in a PLL due to little or no phase margin (especially in combination with a pole at the origin that may be introduced by the VCO 404). Therefore, resistor $R_1$ may be connected in series with $C_1$ to introduce a zero that may increase the phase margin and/or stabilize the PLL. The second capacitor $C_2$ may be included, for example, to reduce spurs, sidebands, jitter, and/or the like, by filtering out voltage pulses that may occur across $R_1$ due to the positive and/or negative pulses in the charge pump current $I_{cp}$. Depending on the implementation details, the second capacitor $C_2$ may introduce another pole, and thus, the value of $C_2$ may selected to be higher (e.g., much higher) than the loop bandwidth of the PLL to preserve the phase margin and/or stability of the PLL.

Figures 6, 7:
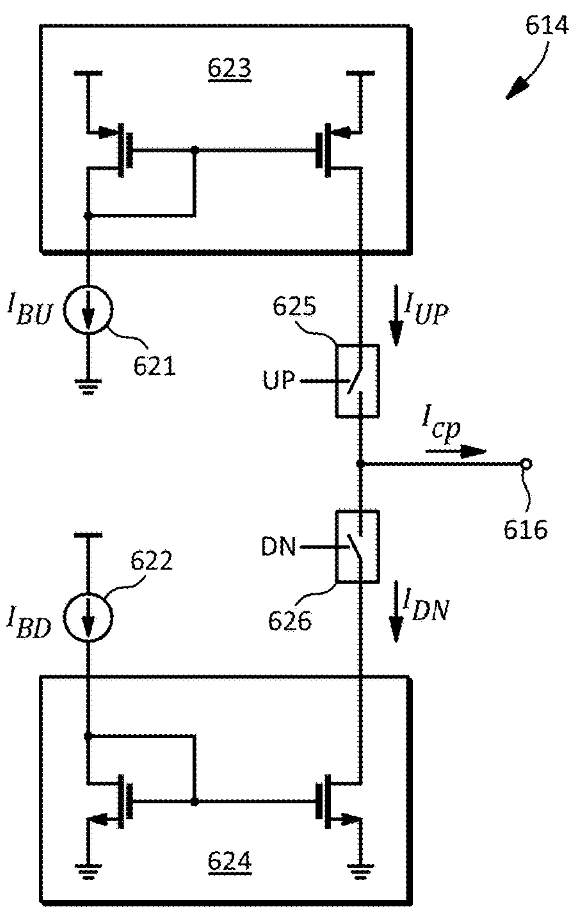
FIG. 6 illustrates an embodiment of a charge pump in accordance with example embodiments of the disclosure.
FIG. 7 illustrates an embodiment of a phase locked loop expressed in terms of complex frequencies in accordance with example embodiments of the disclosure.

FIG. 6 illustrates an embodiment of a charge pump in accordance with example embodiments of the disclosure. The embodiment illustrated in FIG. 6 may be used, for example, with any of the PLLs, VCOs, and/or the like, disclosed herein. The charge pump 614 may include a first current mirror 623 arranged to generate a positive charge pump current $I_{UP}$ at a value $I_{BU}$ determined by a first bias current source 621. The charge pump 614 may also include a second current mirror 624 arranged to generate a negative charge pump current $I_{DN}$ at a value $I_{BD}$ determined by a second bias current source 622. The values of $I_{BU}$ and $I_{BD}$ may be matched, and the current ratios of the current mirrors 623 and 624 may be matched, so the magnitudes of $I_{UP}$ and $I_{DN}$ may be matched.

A first switch 625 may provide the positive charge pump current $I_{UP}$ as the charge pump output current $I_{CP}$ at an output terminal 616 when the UP signal is asserted. A second switch 626 may provide the negative charge pump current $I_{DN}$ as the charge pump output current $I_{CP}$ at the output terminal 616 when the DN signal is asserted. The UP and DN signals may be provided, for example, by a PFD such as the PFD 413 illustrated in FIG. 4.

FIG. 7 illustrates an embodiment of a phase locked loop expressed in terms of complex frequencies in accordance with example embodiments of the disclosure. The embodiment illustrated in FIG. 7 may be based, for example, on the PLL illustrated in FIG. 4, but with one or more components, signals, transfer functions, and/or the like, transformed to the complex frequency domain (e.g., the s-domain).

Referring to FIG. 7, the PLL may include a VCO 704, a frequency divider 712, a summing node 720, a phase frequency detector 713, a charge pump 714, and/or a loop filter 715. The VCO 704 may have a transfer function $2\pi K_{VCO}/s$ and may generate an output signal having a phase $\Phi_{VCO}(s)$. The frequency divider 712 may have a transfer function $1/N_{DIV}$ and may generate a feedback signal having a phase $\Phi_{div}(s)$ by dividing $\Phi_{VCO}(s)$ by $N_{DIV}$. The summing node 720 may generate a phase error $\Phi_e(s)$ by taking the difference between the phase $\Phi_{div}(s)$ of the feedback signal and the phase $\Phi_{ref}(s)$ of a reference signal which may be provided, for example, by a crystal oscillator or any other reference frequency source. The phase frequency detector 713, charge pump 714, and loop filter 715 may transfer functions $1/2\pi$, $I_{CP}$, and Z(s), respectively.

Using the transfer functions illustrated in FIG. 7, the loop gain T(s) of the PLL may be expressed as follows:

$$T(s) = \frac{I_{cp}}{N_{DIV}} \frac{K_{VCO}}{s} Z(s). \quad \text{(Eq. 8)}$$

Substituting Eq. 7c for Z(s), the loop gain T(s) may be rewritten as follows:

$$T(s) = \frac{I_{cp}}{N_{DIV}} \frac{K_{VCO}}{s} \left[ \frac{Z_{dc}\left(1 + \frac{s}{\omega_z}\right)}{s\left(1 + \frac{s}{\omega_p}\right)} \right]. \quad \text{(Eq. 9)}$$

Figure 8:
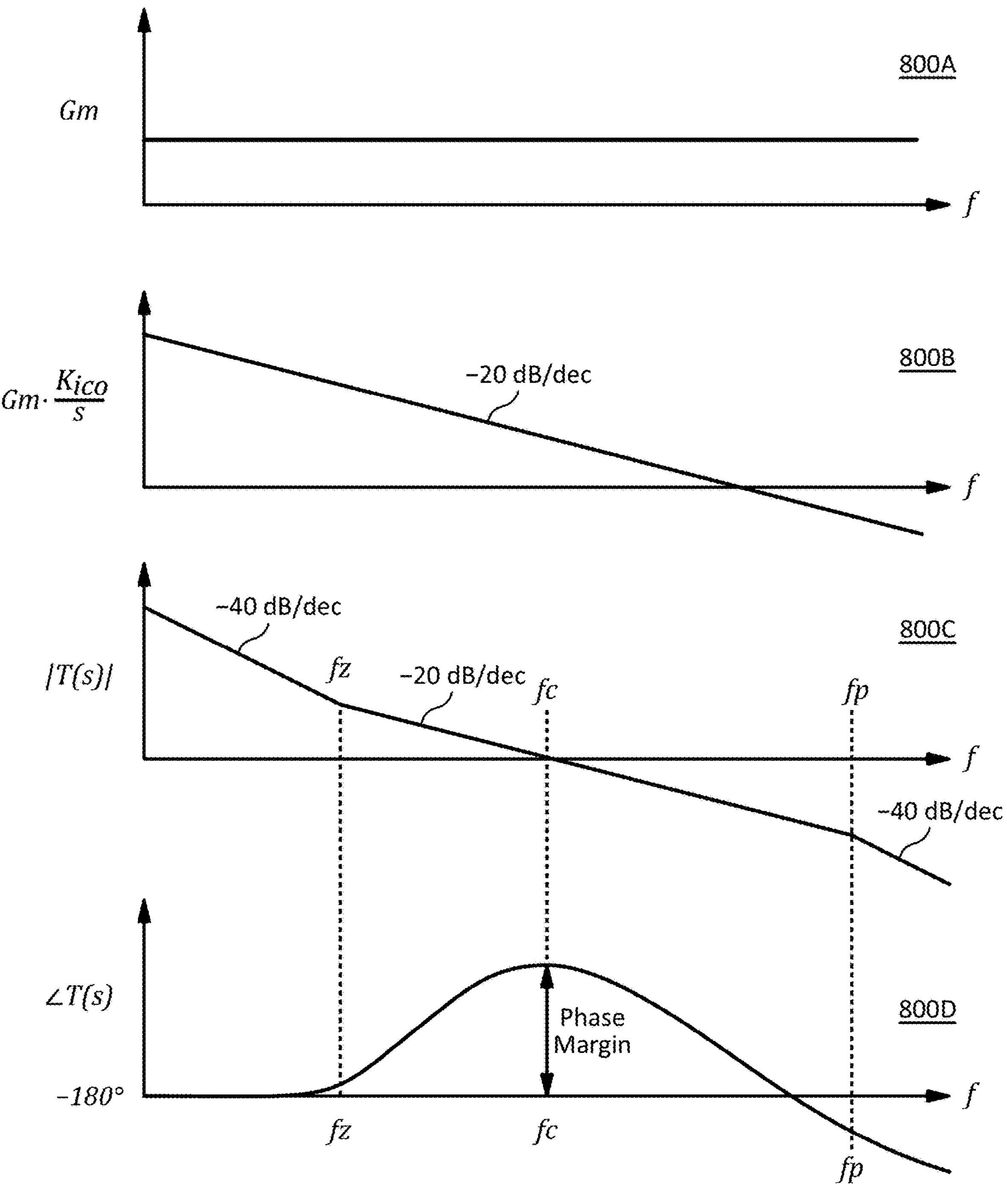
FIG. 8 illustrates example embodiments of frequency response characteristics for a phase locked loop and components thereof in accordance with example embodiments of the disclosure.

FIG. 8 illustrates example embodiments of frequency response characteristics for a phase locked loop and components thereof in accordance with example embodiments of the disclosure. For purposes of illustration, the embodiments illustrated in FIG. 8 may be described in the context of the PLL illustrated in FIG. 7 in which the loop filter 715 may be implemented with a loop filter similar to the loop filter 515 illustrated in FIG. 5 and the VCO 704 may be implemented with a VCO similar to the VCO 300 illustrated in FIG. 3, but other loop filters, VCOs, and/or other components may be used.

Referring to FIG. 8, graph 800A illustrates the magnitude of the transconductance $G_m$ (e.g., voltage-to-current conversion ratio) of the input stage 305 and/or current mirror 306 illustrated in FIG. 3 as a function of frequency. Depending on the implementation details, $G_m$ may be characterized as a low-frequency or DC gain. The vertical ($G_m$) axis and the horizontal (frequency) axis are both illustrated on a logarithmic scale (e.g., a log-log graph). Depending on the implementation details, the magnitude of $G_m$ may be essentially constant over the frequency range illustrated in FIG. 8.

Graph 800B illustrates the magnitude of $G_m$ combined with the magnitude of the frequency response of the gain coefficient $K_{ICO}$ for the current controlled oscillator 307 illustrated in FIG. 3 as a function of frequency, also on a log-log scale. Thus, graph 800B may be characterized as a graph of the magnitude of the gain coefficient $K_{VCO}$ of the VCO 300 illustrated in FIG. 3. The VCO 300 (and/or VCO 704 in FIG. 7) may integrate the control voltage $v_{cont}$ and therefore may contribute a pole in the form of a factor 1/s to the frequency response of the VCO 300 as well as the loop gain T(s) in Eq. 8 and/or Eq. 9. Depending on the implementation details, this pole may impart a slope of −20 decibels/decade (dB/dec) to the magnitude of $G_m$. $K_{ICO}/s$ as illustrated in the graph 800B.

Graph 800C illustrates the magnitude of the loop gain T(s) of the PLL illustrated in FIG. 7 using Eq. 9 (on a log-log scale) in which the zero frequency $\omega_z$ and the pole frequency $\omega_p$ (expressed in radians/second (rad/s) in Eq. 9) may be related to the zero frequency $f_z$ and the pole frequency $f_p$ (expressed in Hz in FIG. 8), respectively, by the expression $\omega=2\pi f$. The magnitude of T(s) may be represented in FIG. 8 as $|T(s)|$.

Depending on the implementation details, a pole may impart a −20 dB/dec slope, and a zero may impart a +20 dB/dec slope. Thus, the initial slope of the magnitude of T(s) may be −40 dB/dec at f=0 due to the two poles at the origin in Eq. 9 (one pole (1/s) from the loop filter 715 and one pole (1/s) from the VCO 704). In some embodiments, two poles at the origin may lead to instability in the PLL. However, the zero at $f_z$ (corresponding to $\omega_z$ in Eq. 9) may turn the slope up by +20 dB/dec, and thus, the magnitude of T(s) may be −20 dB/dec between the zero frequency $f_z$ and the pole frequency $f_p$ where the second pole contributed by the loop filter 715 may turn the slope back down by −20 dB/dec. Thus, the magnitude of T(s) may be −40 dB/dec at frequencies above $f_p$.

The crossover frequency $f_c$, which may also be referred to as the loop bandwidth, may be a frequency at which the magnitude of T(s) may be one (zero on a log scale). In some embodiments, and depending on the implementation details, a PLL may generally be stable when the loop bandwidth frequency falls between the zero frequency and the pole frequency (e.g., far enough away from a zero to ensure an adequate phase margin as illustrated below).

Graph 800D illustrates the phase of T(s) of the PLL illustrated in FIG. 7 as a function of frequency on a log-log scale. The phase of T(s) may be represented in FIG. 8 as Arg or ∠T(s). The initial phase of T(s) may be −180 degrees at f=0 due to the two poles at the origin. The zero at $f_z$, however, may begin turning the phase upward (e.g., at a rate of +45 deg/dec) beginning about a decade before $f_z$. The phase of T(s) may continue to increase toward (but not necessarily reaching) −90 degrees until the third pole at $f_p$ may begin turning the phase back downward (e.g., at a rate of −45 deg/dec) beginning about a decade before $f_p$. The difference between the phase of T(s) at the loop bandwidth $f_c$ and −180 degrees may be referred to as the phase margin. In some embodiments, and depending on the implementation details, the operation of a PLL may be stable if the phase margin is greater than a specific value. Thus, the phase ∠T(s) may include a region around the loop bandwidth $f_c$ in which the phase margin may be adequate (e.g., greater than −180 degrees by a specific amount) to ensure stable operation of the PLL.

Figure 9:
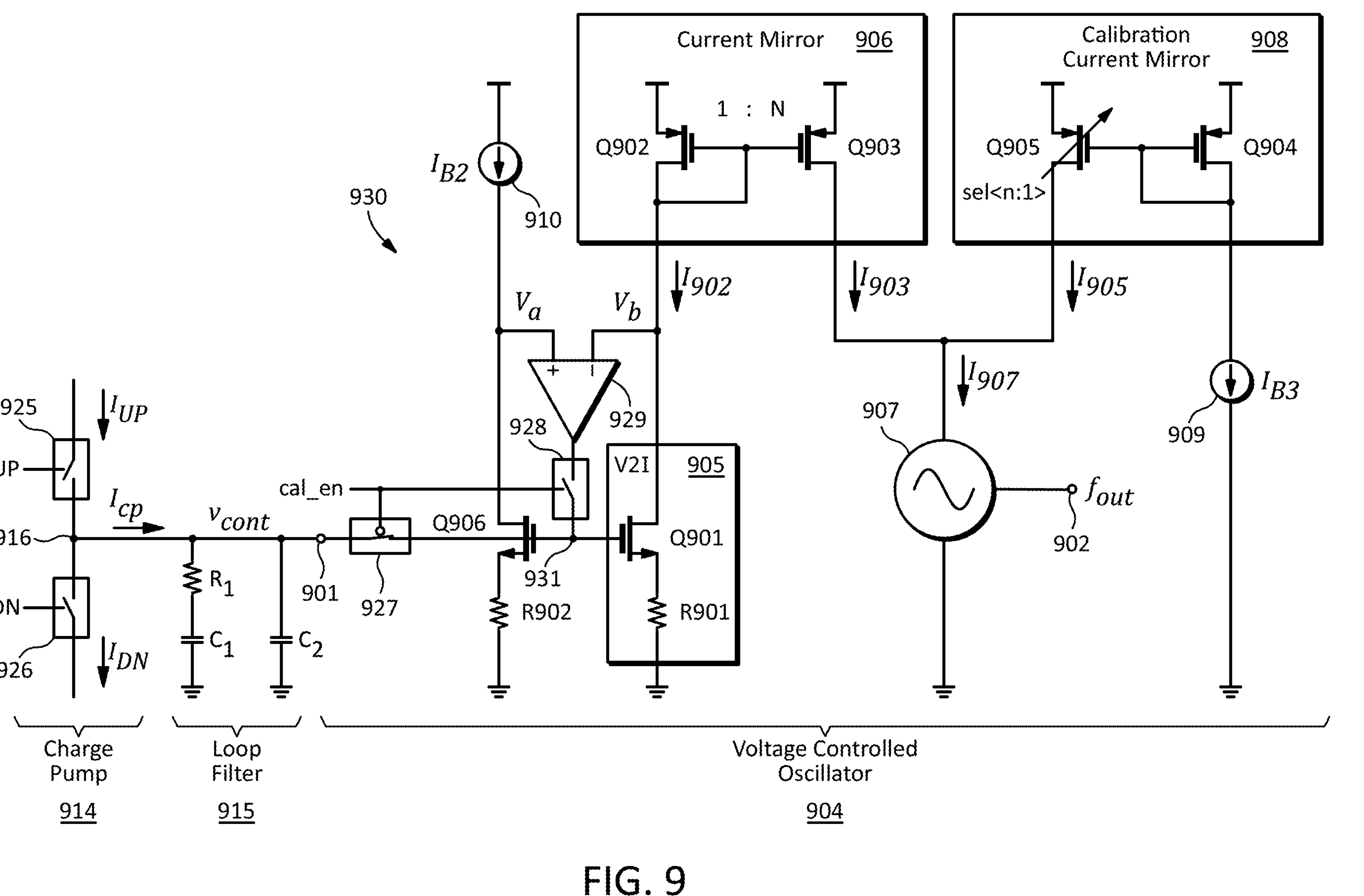
FIG. 9 illustrates an embodiment of a voltage controlled oscillator and calibration scheme in accordance with example embodiments of the disclosure.

FIG. 9 illustrates an embodiment of a voltage controlled oscillator and calibration scheme in accordance with example embodiments of the disclosure. The VCO 904 illustrated in FIG. 9 may include an input stage 905, a current mirror 906, and a current controlled oscillator 907 that may be implemented with components similar to those in the VCO 304 illustrated in FIG. 3 in which similar elements may be indicated by reference numbers ending in, and/or containing, the same digits, letters, and/or the like.

The VCO 904 illustrated in FIG. 9 may also include a calibration current mirror 908 that may generate a calibration current loos that may be added to the current $I_{903}$ from current mirror 906 to generate a combined current $I_{907}$ to drive the current controlled oscillator 907. The calibration current mirror 908 may include a first transistor Q904 having a source connected to a power supply voltage (e.g., $V_{DD}$), a drain connected to receive a bias current $I_{B3}$ from a current source 909, and a gate connected back to the source in a diode-connected arrangement. The calibration current mirror 908 may also include a second transistor (or transistors) Q905 having a source connected to the power supply voltage, a drain connected to generate the calibration current $I_{905}$, and a gate connected to the gate of Q904.

Transistor Q905 may be arranged to generate the calibration current $I_{905}$ as a multiple of the bias current $I_{B3}$. The ratio of the calibration current $I_{905}$ to the bias current $I_{B3}$ may be determined by the value of a selection code (indicated as sel<n:1>) that may have n possible values. For example, in some embodiments, transistor Q905 may be implemented with n parallel transistors having their outputs controlled by n switches. A decoder may control the switches based on the value of the selection code such that the selection code may determine how many of the outputs of the n transistors are connected in parallel and therefore contribute to the calibration current $I_{905}$.

The embodiment illustrated in FIG. 9 may also include a calibration input circuit 930 including a transistor Q906, a resistor R902, a bias current source 910, an operational amplifier (which may also be referred to as an op-amp, opamp, or op amp) 929, and/or switches 927 and 928.

The embodiment illustrated in FIG. 9 may also include a loop filter 915 that may be implemented with an embodiment similar to the loop filter 515 illustrated in FIG. 5. A portion of a charge pump 914 similar to the embodiment illustrated in FIG. 6 is also included in FIG. 9 as an aid to understanding the operation of the VCO 904 and/or calibration scheme.

Figure 10:
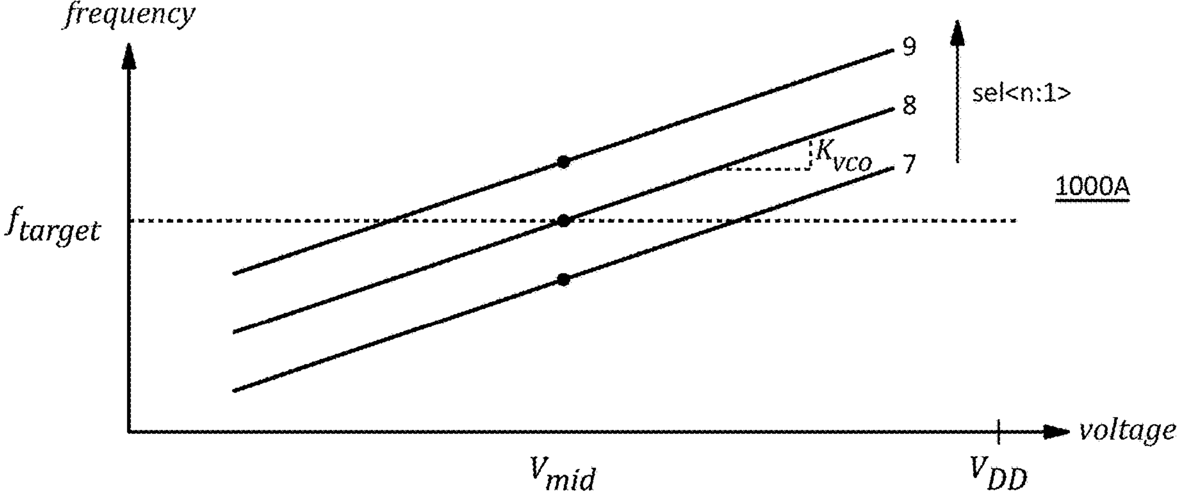
FIG. 10 illustrates an example embodiment of frequency-voltage characteristic for a voltage controlled oscillator and an example embodiment of an output voltage-current characteristic for a charge pump in accordance with example embodiments of the disclosure.
Figure 10:
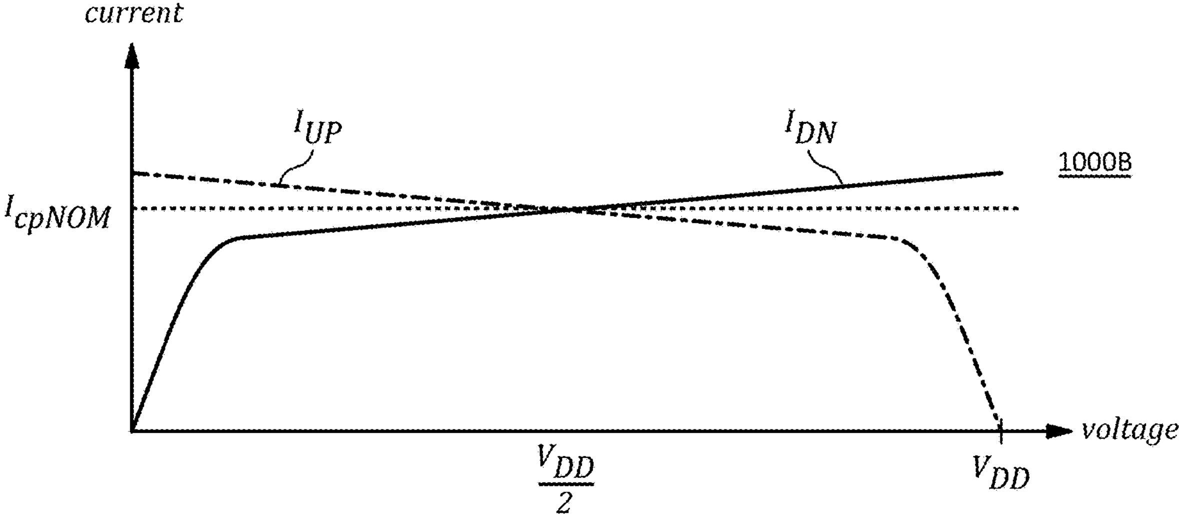

FIG. 10 illustrates an example embodiment of frequency-voltage characteristic for a voltage controlled oscillator and an example embodiment of an output voltage-current characteristic for a charge pump in accordance with example embodiments of the disclosure. The graphs illustrated in FIG. 10 may illustrate, for example, the frequency-voltage characteristic for the voltage controlled oscillator 904 and the output voltage-current characteristic for the charge pump 914 illustrated in FIG. 9.

An example embodiment of a calibration operation for the VCO 904 may proceed as follows with reference to FIG. 9 and/or FIG. 10. During a calibration operation, a calibration enable signal (indicated as cal_en) may be asserted to open switch 927 which may cause the input stage (e.g., voltage-to-current converter) 905 to be isolated from the loop filter 915, thereby opening the loop of a PLL in which the embodiment illustrated in FIG. 9 may be used. Asserting the calibration enable signal may also close switch 928, thereby connecting the output of op-amp 929 to the gates of Q901 and Q906 at node 931. The op-amp 929 may drive the gates of Q901 and Q906 with a voltage that may equalize the voltages $V_a$ and $V_b$ at the drains of Q906 and Q901, respectively. This may cause Q901 and Q906 to operate in a manner similar to a current mirror. Thus, the current 902 may be driven to a value that may be equal to the bias current $I_{B2}$ (assuming the geometries of Q901 and Q906 and/or the values of R901 and R902 are the same) or a multiple of $I_{B2}$ (if the geometries of Q901 and Q906 and/or the values of R901 and R902 are scaled).

The current $I_{902}$ established in Q901 by the op-amp 929 may also flow through Q902 in the current mirror 906 where it may be mirrored in Q903 to generate $I_{903}$ at a scale factor determined by the current mirror ratio 1:N. The calibration current $I_{905}$ may be adjusted using the selection code sel<n:1> until the combined current $I_{907}$ applied to the current controlled oscillator 907 is adjusted to a value that causes the output frequency $f_{out}$ to be equal or close to a target value $f_{target}$ when the voltage of the input signal (e.g., $v_{cont}$ at node 931) is equal or close to a calibration value such as the midpoint of a power supply voltage $V_{DD}$ (e.g., $V_{mid} \approx V_{DD}/2$) as illustrated in graph 1000A in FIG. 10. The value $V_{mid}$ may be chosen, for example, because the positive and negative charge pump currents $I_{UP}$ and $I_{DN}$ may be matched when the output of the charge pump 914 is operating at or near the midpoint $V_{mid}$ of the power supply voltage $V_{DD}$ as explained in more detail below with respect to graph 1000B in FIG. 10.

During calibration, in some embodiments, the voltage at node 931 may not be directly controlled. However, the values of $I_{B2}$ and/or R902 may be selected to maintain the voltage of node 931 at or near a specific value. For example, the current $I_{B2}$ flowing through Q906 and R902 may establish a voltage across R902 which, combined with a threshold voltage between the gate and source of Q906, may maintain node 931 at a voltage equal or close to a specific value such as $V_{mid}$ while the calibration current $I_{905}$ is being adjusted by changing the selection code sel<n:1>.

Referring to graph 1000A in FIG. 10, the curves (which in this example may be lines) identified as 7, 8, and/or 9 illustrate the output frequency $f_{out}$ of the VCO 904 as a function of the input signal $v_{cont}$ for these three values of sel<n:1> when the VCO 904 is operating at a specific combination of PVT values. The slope of the curves may be determined by the gain coefficient $K_{VCO}$ of the VCO 904. For purposes of illustration, the embodiments shown in FIG. 9 and FIG. 10 may be described in the context of a calibration current mirror 908 for which the selection code may have a range of 1 to 16, but any number and/or configuration of selection codes may be used.

As illustrated in graph 1000A, the curve corresponding to selection code 8 may intersect the target frequency at or near a point where the voltage of the input signal $v_{cont}$ is $V_{mid}$ at the specific combination of PVT values at which the VCO 904 may be calibrated. However, at one or more different PVT values, a curve corresponding to a different selection code may intersect the target frequency at or near $V_{mid}$. For example, if the VCO 904 is calibrated at a lower temperature, the curve corresponding to selection code 7 may intersect the target frequency at or near $V_{mid}$. As another example, if the VCO 904 is calibrated at a higher temperature, the curve corresponding to selection code 9 may intersect the target frequency at or near $V_{mid}$.

Graph 1000B in FIG. 10 illustrates the positive and negative charge pump currents $I_{UP}$ and $I_{DN}$, respectively, as a function of the voltage at the output node 916 of the charge pump 914. The value $I_{cpNOM}$ shown with a dotted line may represent a nominal (e.g., ideal) current value for $I_{UP}$ and/or $I_{DN}$. The values of $I_{UP}$ and $I_{DN}$ may be equal at or near the midpoint $V_{mid}$ but may become mismatched by an increasing amount as the voltage at the output node 916 of the charge pump 914 becomes away from $V_{mid}$. Thus, depending on the implementation details, spurs, jitter, phase noise, and/or the like, caused by mismatches in the positive and negative charge pump currents $I_{UP}$ and $I_{DN}$ may be reduced or minimized when the voltage at the output node 916 of the charge pump 914 remains close to $V_{mid}$.

The calibration enable signal cal_en may be de-asserted after the selection code sel<n:1> is determined. De-asserting cal_en may open switch 928, thereby decoupling the current $I_{902}$ from the bias current $I_{B2}$ and enabling the input stage 905 to perform a voltage-to-current conversion based on the voltage at node 931. De-asserting cal_en may also close switch 927 which may connect node 931 to input terminal 901, thereby applying the input signal $v_{cont}$ to node 931 and closing the feedback control loop of the PLL. The VCO 904 may then operate using the calibration current $I_{905}$ determined by the selection code selected during calibration. For example, in some embodiments, the calibration current $I_{905}$ may remain constant as the current $I_{905}$ varies based on the input signal $v_{cont}$.

In some embodiments, and depending on the implementation details, one or more operating characteristics of the VCO 904 may drift based on changes in one or more PVT values. For example, for a constant value of $I_{907}$, the output frequency $f_{out}$ of the current controlled oscillator 907 may increase as the temperature decreases. Thus, if the VCO 904 is initially operating at the frequency at which it was calibrated, the output frequency $f_{out}$ may initially be locked at a target frequency $f_{target}$ with the value of $v_{cont}$ settled at or near $V_{mid}$. As the temperature of the PLL decreases, the feedback loop of the PLL may reduce the value of $v_{cont}$ to cause the frequency $f_{out}$ to remain locked at $f_{target}$. Thus, the value of $v_{cont}$ may settle at a value lower than $V_{mid}$ when the VCO operates at a lower temperature than it was calibrated at.

Figure 11:
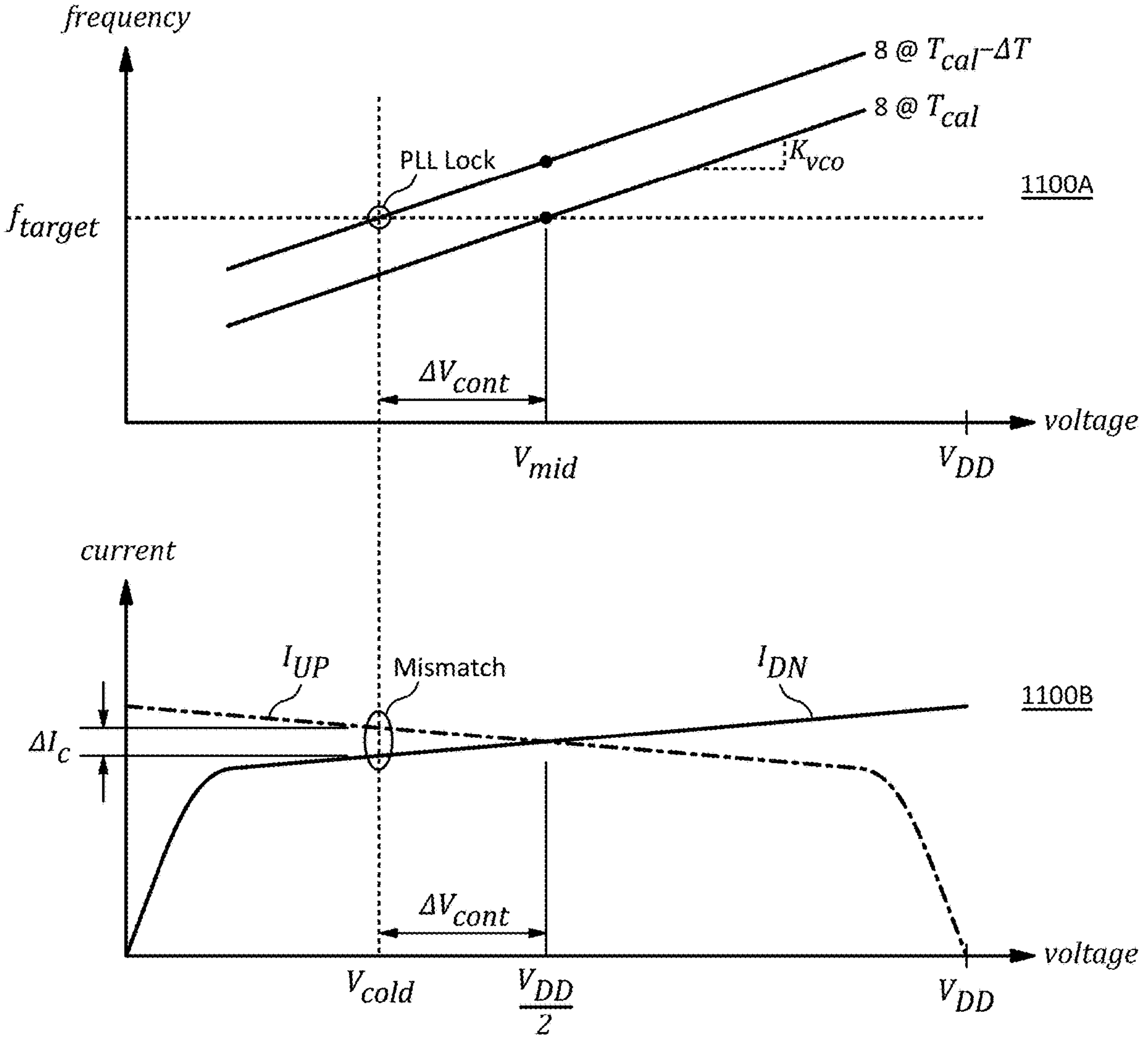
FIG. 11 illustrates example embodiments of a frequency-voltage characteristic of a voltage controlled oscillator and a current-voltage characteristic of a charge pump at a reduced operating temperature in accordance with example embodiments of the disclosure.

FIG. 11 illustrates example embodiments of a frequency-voltage characteristic of a voltage controlled oscillator and a current-voltage characteristic of a charge pump at a reduced operating temperature in accordance with example embodiments of the disclosure. The graphs illustrated in FIG. 11 may illustrate, for example, the frequency-voltage characteristic for the voltage controlled oscillator 904 and the output voltage-current characteristic for the charge pump 914 illustrated in FIG. 9.

Referring to FIG. 11, the lower curve in graph 1100A illustrates the frequency-voltage characteristic of the VCO 904 when operating at a temperature $T_{cal}$ at which it was calibrated using a selection code (e.g., 8) in a manner similar to graph 1000A in FIG. 10. The upper curve in graph 1100A illustrates the frequency-voltage characteristic of the VCO 904 when operating at a lower temperature ($T_{cal}-\Delta T$) than it was calibrated at while using the same selection code (e.g., 8) that it was calibrated with. The temperature change $-\Delta T$ may cause the frequency-voltage curve to drift upward, thereby causing a frequency error. To eliminate the frequency error and keep $f_{out}$ locked to the reference frequency, the PLL may reduce the input signal $v_{cont}$ by an amount $-\Delta v_{cont}$. Thus, $V_{cont}$ may settle to a new value $V_{cold}=V_{mid}-\Delta V_{cont}$.

Referring to graph 1100B in FIG. 11, operating input signal $v_{cont}$ at the new settled value of $V_{cold}=V_{mid}-\Delta V_{cont}$ may cause the charge pump 914 to operate at an output voltage $V_{mid}-\Delta V_{cont}$ at which the positive charge pump current $I_{UP}$ and the negative charge pump current $I_{DN}$ may be mismatched (e.g., by an amount $\Delta I_c$). Depending on the implementation details, the mismatched charge pump currents may cause spurs, jitter, phase noise, and/or the like, in the PLL 904.

Figure 12:
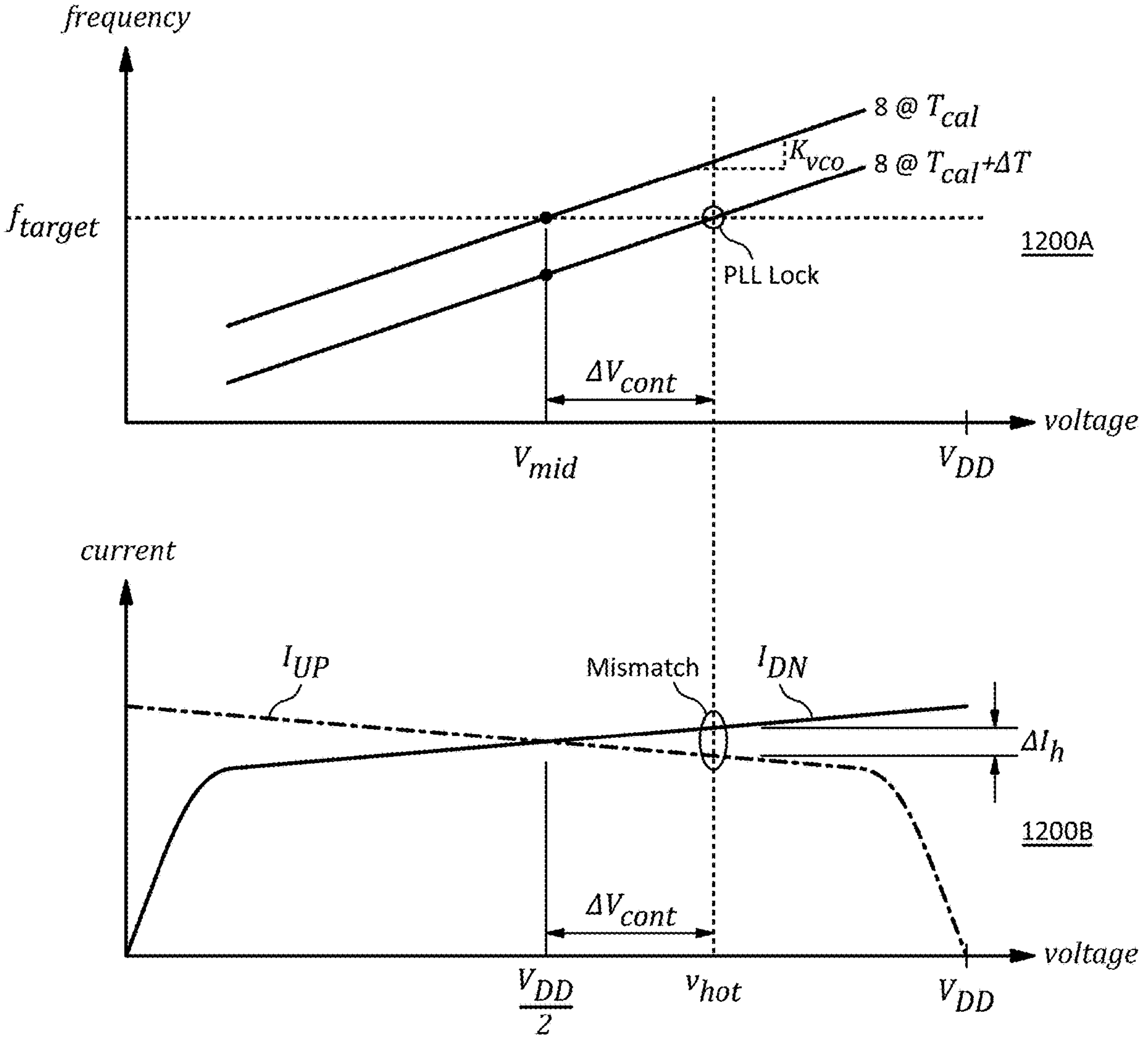
FIG. 12 illustrates example embodiments of a frequency-voltage characteristic of a voltage controlled oscillator and a current-voltage characteristic of a charge pump at an increased operating temperature in accordance with example embodiments of the disclosure.

FIG. 12 illustrates example embodiments of a frequency-voltage characteristic of a voltage controlled oscillator and a current-voltage characteristic of a charge pump at an increased operating temperature in accordance with example embodiments of the disclosure. In some aspects the embodiment illustrated in FIG. 12 may be similar to the embodiment illustrated in FIG. 11, except that the graphs in FIG. 12 illustrate curves for a PLL 904 that may operate at a higher temperature ($T_{cal}+\Delta T$) than it was calibrated at while using the same selection code (e.g., 8) that it was calibrated with.

The lower curve in graph 1200A illustrates the frequency-voltage characteristic of the VCO 904 when operating at $T_{cal}+\Delta T$. The temperature change $+\Delta T$ may cause the frequency-voltage curve to drift downward, thereby causing the PLL to increase the input signal $v_{cont}$ to settle to a new value $V_{hot}=V_{mid}+\Delta V_{cont}$. Referring to graph 1200B, this may cause the charge pump 914 to operate at an output voltage $V_{mid}+\Delta V_{cont}$ at which the positive charge pump current $I_{UP}$ and the negative charge pump current $I_{DN}$ may be mismatched (e.g., by an amount $\Delta I_h$).

One possible approach to reducing the mismatch between the positive and negative charge pump currents $I_{UP}$ and $I_{DN}$ when the input signal $v_{cont}$ settles at a value away from $V_{mid}$ is to improve the current matching between $I_{UP}$ and $I_{DN}$ (e.g., flatten the curves of $I_{UP}$ and $I_{DN}$ so they are closer to the nominal value of $I_{cpNOM}$) over a greater portion of the voltage range between zero and $V_{DD}$. For example, the output dynamic range of a charge pump may be increased by increasing the impedance using a low voltage cascode arrangement. As another example, a differential structure and/or unity gain buffer may be used to implement charge sharing and/or distribution in a charge pump. Depending on the implementation details, however, these approaches may increase the cost, complexity, design effort, and/or the like, for a charge pump and may still not provide adequate current matching.

Figure 13:
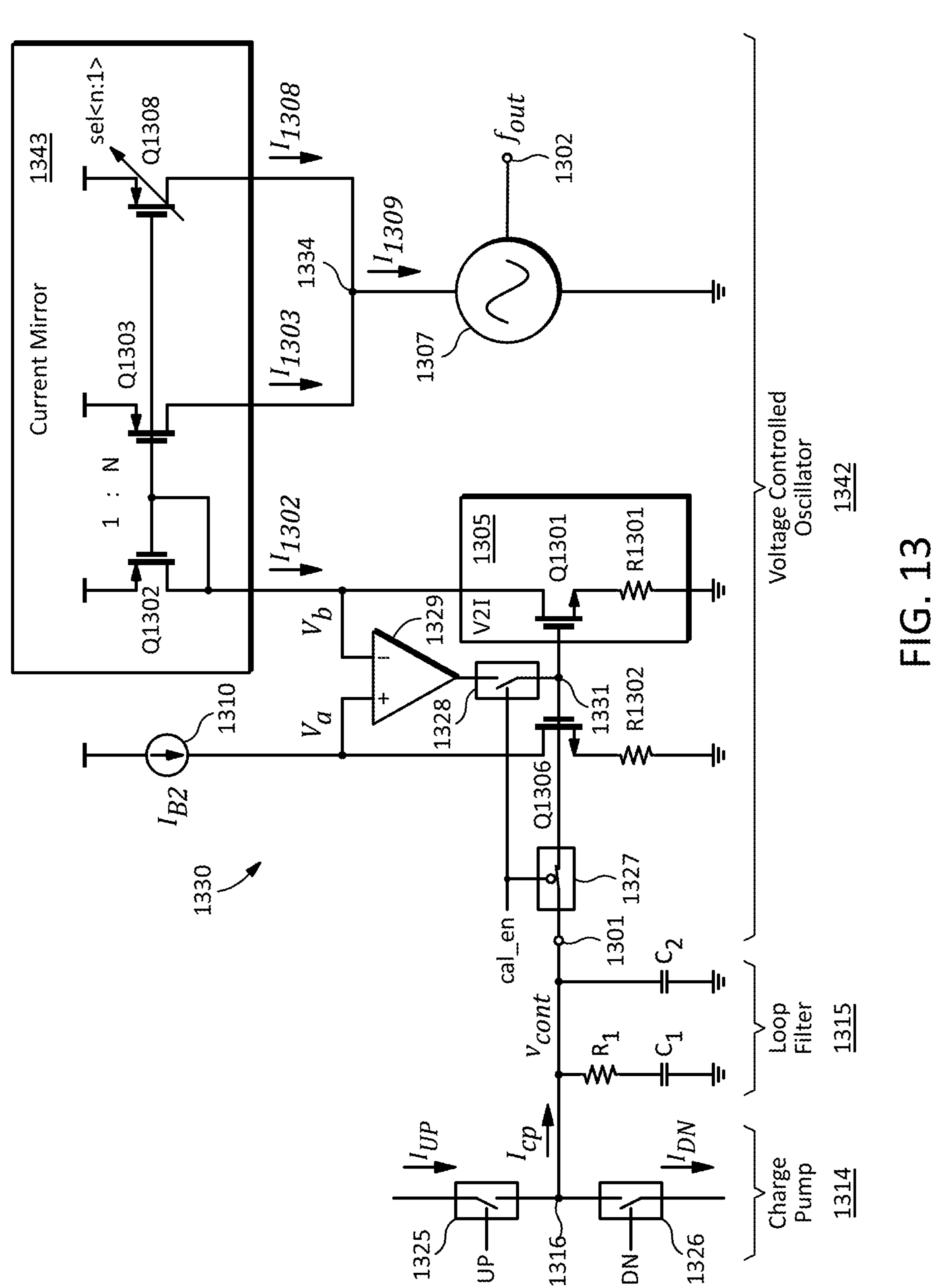
FIG. 13 illustrates an embodiment of an oscillator having a modified gain coefficient in accordance with example embodiments of the disclosure.

FIG. 13 illustrates an embodiment of an oscillator having a modified gain coefficient in accordance with example embodiments of the disclosure. The oscillator 1342 illustrated in FIG. 13 may include an input stage 1305, a current controlled oscillator 1307, and a calibration input circuit 1330 that may be implemented with components similar to those in the embodiment illustrated in FIG. 9 in which similar elements may be indicated by reference numbers ending in, and/or containing, the same digits, letters, and/or the like.

In the oscillator 1342 illustrated in FIG. 13, however, the gain coefficient $K_{VCO}$ may be increased, for example, by arranging one or more transistors Q1308 (which may be used for calibration based on a selection code sel<n:1>) as a current mirror with Q1302. For example, transistor Q1308 may have a source connected to a first power supply voltage (e.g., $V_{DD}$) and a gate connected to the gate of Q1302. The drain of Q1308 may therefore provide a calibration current $I_{1308}$ that may be controlled by $I_{1302}$ which, in turn, may be controlled by the input signal $v_{cont}$ received at input terminal 1301. Thus, the current path for $I_{1303}$ through Q1303 and the current path for $I_{1308}$ through Q1308 may both be controlled by the input signal $v_{cont}$. The currents $I_{1303}$ and $I_{1308}$ may be combined (e.g., summed at node 1334) to generate $I_{1309}$ which may be used to drive the current controlled oscillator 1307. This may increase the gain coefficient $K_{VCO}$ of the oscillator 1342 (which may cause the slope of $K_{VCO}$ illustrated in graph 1200A in FIG. 12 to increase). Increasing $K_{VCO}$, however, may involve changing one or more parameters of a VCO and/or PLL as explained in more detail below. Although Q1308 may be illustrated as being configured to provide the current $I_{1308}$ as a calibration current based on a selection signal sel<n:1>, in other embodiments, transistor Q1308 may be implemented without a calibration function.

Figure 14:
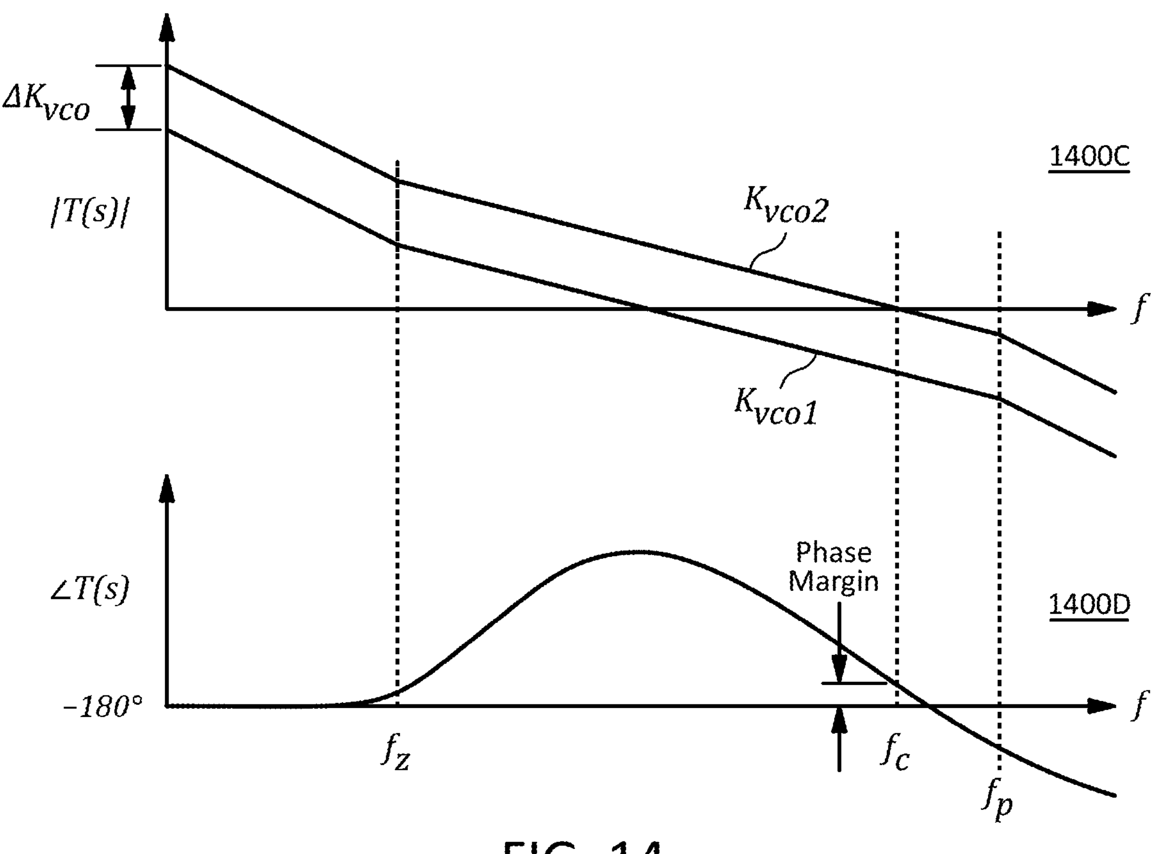
FIG. 14 illustrates example embodiments of frequency response characteristics for a phase locked loop and components thereof having a modified gain coefficient in accordance with example embodiments of the disclosure.

FIG. 14 illustrates example embodiments of frequency response characteristics for a phase locked loop and components thereof having a modified gain coefficient in accordance with example embodiments of the disclosure. The embodiments illustrated in FIG. 14 may illustrate, for example, one or more effects of changing $K_{VCO}$ in the oscillator 1342 illustrated in FIG. 13.

Referring to FIG. 14, the bottom curve (identified by $K_{VCO1}$) in graph 1400C illustrates the magnitude of the loop gain T(s) of a PLL without a modified $K_{VCO}$ such as that illustrated in graph 800C in FIG. 8. The top curve (identified by $K_{VCO2}$) in graph 1400C illustrates the magnitude of the loop gain T(s) of a PLL in which $K_{VCO}$ has been increased by $\Delta K_{VCO}$, for example, using the technique illustrated in FIG. 13. As illustrated in graph 1400C, increasing $K_{VCO}$ may cause T(s) to shift upward by an amount $\Delta K_{VCO}$. Although increasing $K_{VCO}$ may enable a VCO and/or PLL to operate over a relatively wide frequency range, an upward shift in the magnitude of T(s) may cause the loop bandwidth to shift to a higher frequency, thereby reducing or eliminating the phase margin as illustrated in graph 1400D in FIG. 14 (compared, for example, to the phase margin illustrated in graph 800D in FIG. 8). Depending on the implementation details, reducing the phase margin may cause a PLL to become unstable.

To maintain the stability of a PLL in which the gain coefficient $K_{VCO}$ has been increased, one or more parameters of the PLL and/or VCO may be adjusted to maintain the loop gain at a relatively constant value. For example, referring to Eq. 8 and/or Eq. 9, the value of $I_{cp}$ may be reduced to compensate for an increase in $K_{VCO}$. The charge pump current Icy may be reduced, for example, by reducing the values of $I_{UP}$ and $I_{DN}$ (e.g., by reducing the geometry and/or number of mirror transistors in current mirrors 623 and/or 624 illustrated in FIG. 6). Reducing $I_{cp}$, however, may increase the noise of the charge pump. Alternatively, or additionally, the loop gain may be adjusted by increasing the value of one or more capacitors in the loop filter 915. However, this may increase the area occupied by the one or more capacitors.

Figure 15:
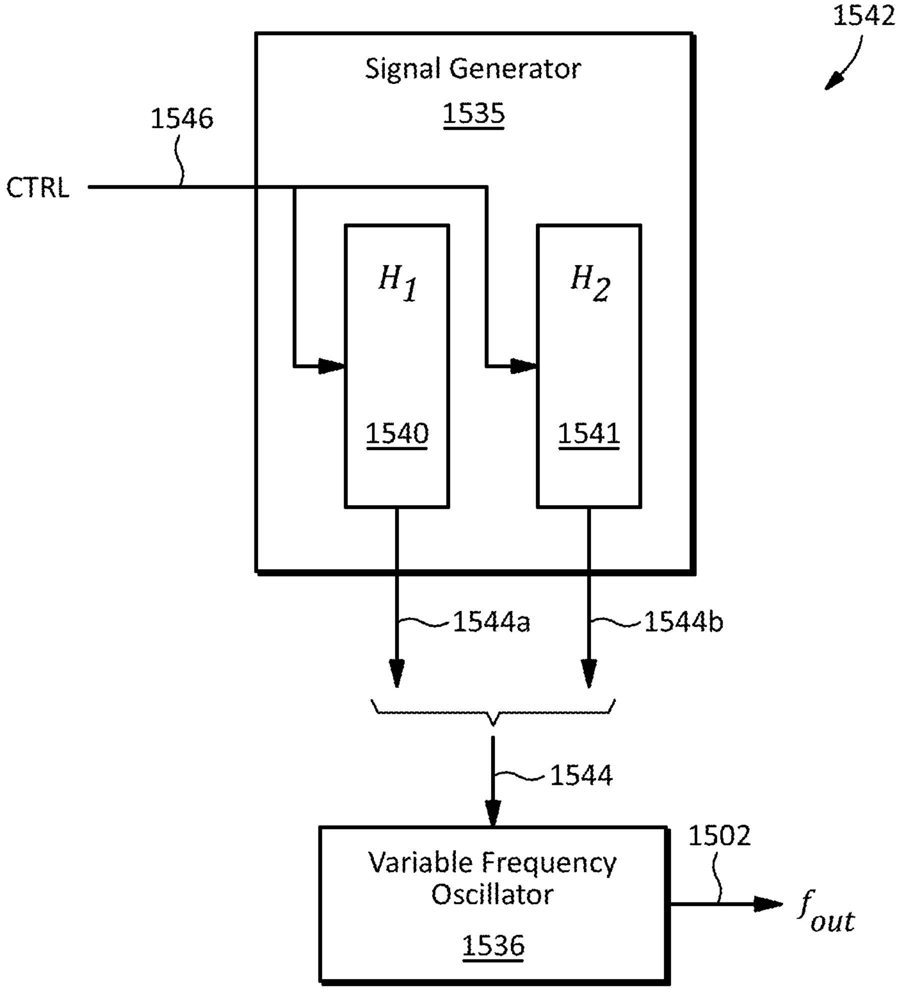
FIG. 15 illustrates an embodiment of an oscillator having one or more frequency characteristics in accordance with example embodiments of the disclosure.

FIG. 15 illustrates an embodiment of an oscillator having one or more frequency characteristics in accordance with example embodiments of the disclosure. The oscillator 1542 illustrated in FIG. 15 may include a signal generator 1535 and/or a variable frequency oscillator (VFO) 1536. The variable frequency oscillator 1536 may generate an output signal 1502 having a frequency $f_{out}$ based on a first signal 1544. The signal generator 1535 may generate the first signal 1544 based on a second signal 1546 which may be referred to as a control signal CTRL. The signal generator 1535 may include a first path (e.g., a first signal path) 1540 that may generate a first portion 1544*a* of the first signal 1544 based on the second signal 1546. The signal generator 1535 may also include a second path (e.g., a second signal path) 1541 that may generate a second portion 1544*b* of the first signal 1544 based on the second signal 1546.

In some embodiments, the first portion 1544*a* and the second portion 1544*b* may be combined, at least partially, into a signal 1544 that may be applied to the variable frequency oscillator 1536. The first portion 1544*a* and the second portion 1544*b* may be combined, for example, using a combining circuit. In an embodiment in which the signal 1544 may be implemented as a current, a combining circuit may be implemented, for example, with a summing node which may sum the first portion 1544*a* (e.g., a first portion of the current) and the second portion 1544*b* (e.g., a second portion of the current). Alternatively, or additionally, the first portion 1544*a* and the second portion 1544*b* may be applied separately (at least partially) to the variable frequency oscillator 1536.

The first path 1540 may have a first frequency characteristic indicated generally by a first transfer function $H_1$, and the second path 1541 may have a second frequency characteristic indicated generally by a second transfer function $H_2$. The first portion 1544*a* of the first signal 1544 may have a first frequency characteristic (e.g., with respect to the second signal 1546), and the second portion 1544*b* of the first signal 1544 may have a second frequency characteristic (e.g., with respect to the second signal 1546). For purposes of illustration, some embodiments may be described in the context of continuous structures and/or signals in which one or more of the transfer functions $H_1$ and/or $H_2$ may be expressed, at least partially, as a function of complex frequency s, for example, as $H_1(s)$ and/or $H_2(s)$. Other embodiments, however, may be implemented at least partially with discrete structures and/or signals in which case one or more of the transfer functions $H_1$ and/or $H_2$ may be expressed, at least partially, as a function of discrete values, for example, as $H_1(z)$ and/or $H_2(z)$.

Although the first path 1540 and the second path 1541 illustrated in FIG. 15 are not limited to any specific forms, in some example embodiments, they may be implemented, for example, using current mirror transistors. For example, in some embodiments, the first path 1540 may be implemented using a first current mirror transistor that may generate the first portion 1544*a* of the first signal 1544 based on the second signal 1546, and the second path 1541 may be implemented using a second current mirror transistor that may generate the second portion 1544*b* of the first signal 1544 based on the second signal 1546.

Although the transfer functions $H_1$ and/or $H_2$ are not limited to any specific forms, in some example embodiments, the transfer function $H_1$ may be implemented with a pass-through function (e.g., $H_1(s)=1$), and the transfer function $H_2$ may be implemented with low pass function (e.g., $H_2(s)=1/(1+RCs)$) where R and C may represent the resistance and capacitance, respectively, of a low pass RC filter.

Depending on the implementation details, the oscillator 1542 illustrated in FIG. 15 may enable frequency response shaping of the oscillator 1542 and/or another system (e.g., a PLL) in which the oscillator 1542 may be used. For example, in some embodiments, the first path 1540 may generate the first portion 1544*a* of the signal 1544 having a relatively high frequency characteristic (which may also be referred to as an AC characteristic), and the second path 1541 may generate the second portion 1544*b* of the signal 1544 having a relatively low frequency characteristic (which may also be referred to as a DC characteristic). Depending on the implementation details, this may enable the oscillator 1542 and/or another system in which the oscillator 1542 may be used to provide improved performance, efficiency, flexibility, cost, calibration, stability, and/or the like. For example, in some embodiments, the use of signal paths having different frequency characteristics may enable a gain coefficient of the oscillator 1542 to be increased with little or no change to other components, loop coefficients, and/or the like.

Although the oscillator 1542 illustrated in FIG. 15 is not limited to any specific application, in one example application, the oscillator 1542 may be used in a PLL in which the control signal CTRL may be driven, directly or indirectly, by an input signal such as $v_{cont}$.

Figure 16:
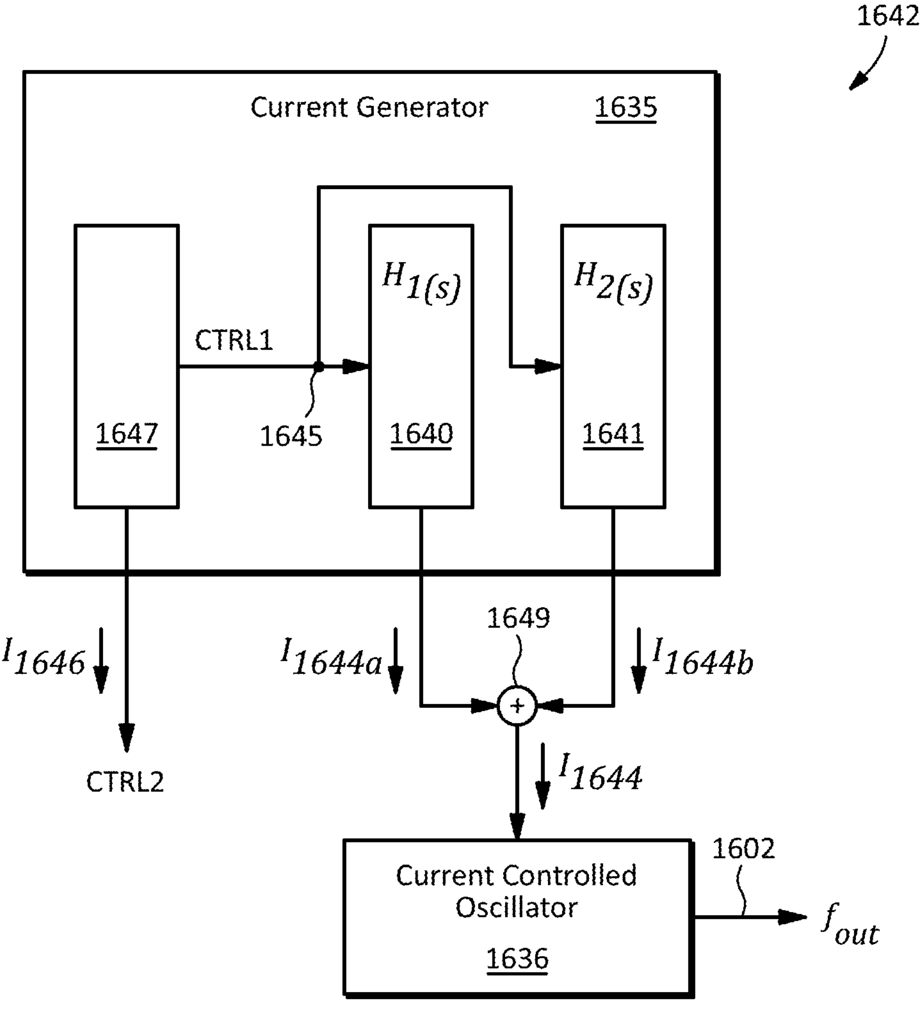
FIG. 16 illustrates an example embodiment of an oscillator having one or more frequency characteristics in accordance with example embodiments of the disclosure.

FIG. 16 illustrates an example embodiment of an oscillator having one or more frequency characteristics in accordance with example embodiments of the disclosure. The oscillator 1642 illustrated in FIG. 16 may provide one example of how the oscillator 1542 illustrated in FIG. 15 may be implemented. For example, the signal generator 1535 and/or the variable frequency oscillator 1536 illustrated in FIG. 15 may be implemented with a current generator 1635 and/or current controlled oscillator 1636, respectively, illustrated in FIG. 16.

The current generator 1635 may include a first current path 1640 that may have a transfer function $H_1(s)$ and may generate a first portion $I_{1644a}$ of a current $I_{1644}$ based on a first control signal CTRL1. The current generator 1635 may also include a second current path 1641 that may have a transfer function $H_2(s)$ and may generate a second portion $I_{1644b}$ of the current $I_{1644}$ based on the first control signal CTRL1. The first portion $I_{1644a}$ and the second portion $I_{1644b}$ may be combined by a combining circuit (e.g., a summing node) 1649 to generate the current $I_{1644}$ which may be applied to the current controlled oscillator 1636 to control the frequency $f_{out}$ of the output signal 1602.

The current generator 1635 may include a signal converter 1647 that may generate the first control signal CTRL1 (which may be referred to as an intermediate signal) at node 1645 based on a second control signal CTRL2. For example, the signal converter 1647 may be implemented as a third current path that may convert the second control signal CTRL2 from a current $I_{1646}$ to a voltage at node 1645.

Although the current generator 1635 and/or current paths 1640 and/or 1641 illustrated in FIG. 16 are not limited to any specific form, in some embodiments, they may be implemented with a current mirror that may enable frequency response shaping of the oscillator 1642 and/or another system (e.g., a PLL) in which the oscillator 1642 may be used.

Figure 17:
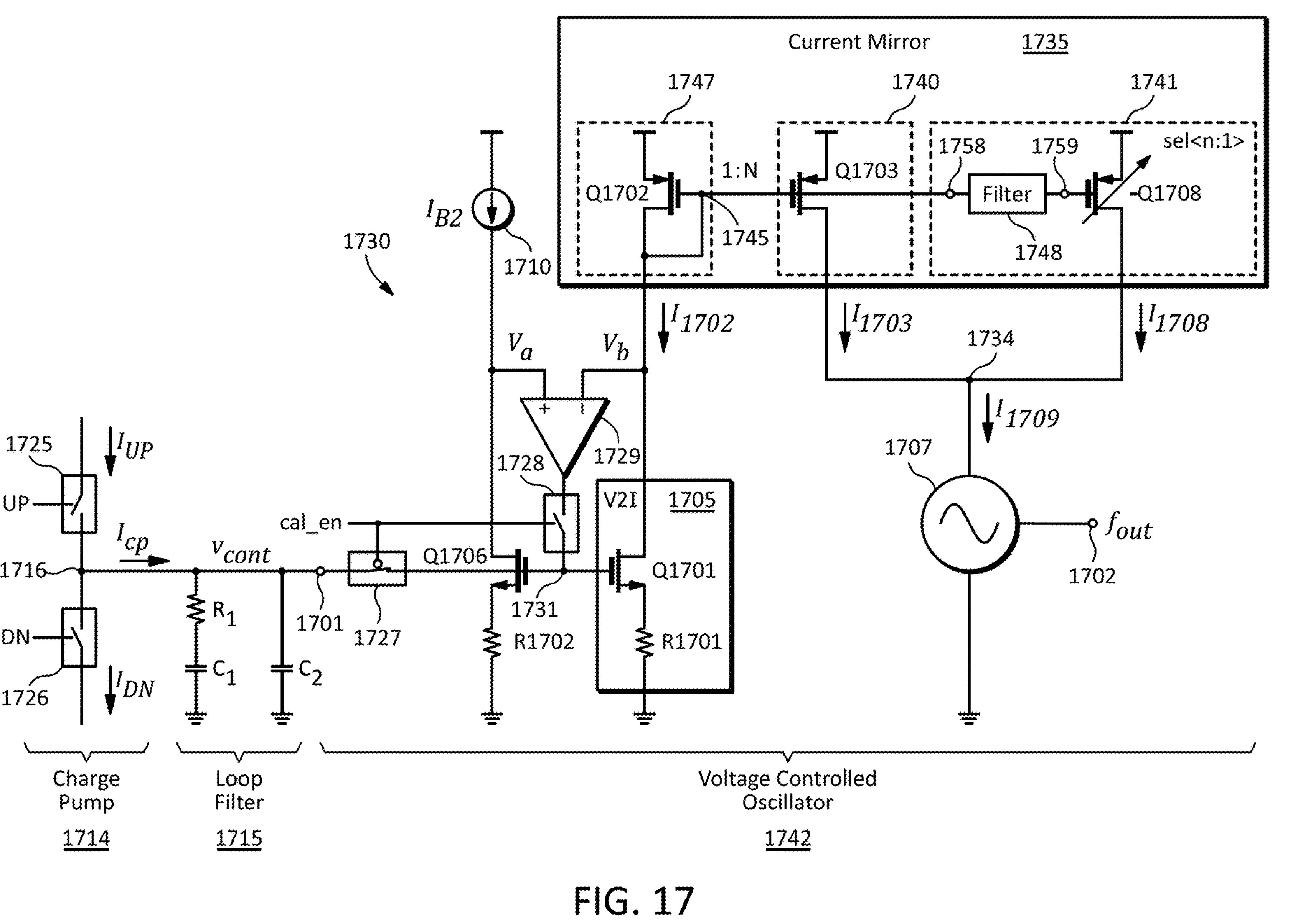
FIG. 17 illustrates an example embodiment of a voltage controlled oscillator having one or more frequency characteristics in accordance with example embodiments of the disclosure.

FIG. 17 illustrates an example embodiment of a voltage controlled oscillator having one or more frequency characteristics in accordance with example embodiments of the disclosure. The VCO 1742 illustrated in FIG. 17 may be used, for example, to implement the oscillator 1642 illustrated in FIG. 16.

Referring to FIG. 17, the VCO 1742 may include an input stage 1705, a current controlled oscillator 1707, and a calibration input circuit 1730 that may be implemented with components similar to those in the embodiment illustrated in FIG. 9 and/or FIG. 13 in which similar elements may be indicated by reference numbers ending in, and/or containing, the same digits, letters, and/or the like.

The VCO 1742 may also include a current mirror 1735 that in some aspects may be similar to the current mirror 1343 illustrated in FIG. 13. However, the current mirror 1735 illustrated in FIG. 17 may also include a filter (e.g., a low pass filter (LPF)) 1748 having a first terminal 1758 connected to the gates of Q1702 and Q1703 (at node 1745) and a second terminal 1759 connected to the gate of Q1708. Depending on the implementation details, the LPF 1748 may cause the current $I_{1708}$ generated by Q1708 to have a different frequency characteristic than the current $I_{1703}$ generated by Q1703. Thus, transistor Q1703 may form a first current path 1740 that may generate $I_{1703}$ as an AC or relatively high frequency portion of the current $I_{1709}$ based on the voltage at node 1745. The low pass filter 1748 and transistor Q1708 may form a second current path 1741 that may generate $I_{1708}$ as a DC or relatively low frequency portion of the current $I_{1709}$ based on the voltage at node 1745. The currents $I_{1703}$ and $I_{1708}$ may be combined at summing node 1734 to generate the current $I_{1709}$ which may control the output frequency $f_{out}$ of current controlled oscillator 1707. Transistor Q1702 may function as a signal converter 1747 to convert current $I_{1702}$ to an intermediate signal (e.g., a voltage) a node 1745.

The use of current paths having different frequency characteristics may enable frequency response shaping of the oscillator 1742 and/or another system (e.g., a PLL) in which the oscillator 1742 may be used. For example, a DC or low frequency portion of the gain coefficient $K_{VCO}$ of the VCO 1742 may be increased because the current $I_{1708}$ (which may vary based on the input signal $v_{cont}$) may be added to the total current $I_{1709}$ used to control the output frequency $f_{out}$. However, using a low pass filter 1748 having a pole and/or zero at one or more frequencies below the loop bandwidth frequency $f_c$ may reduce or effectively eliminate the contribution of $I_{1708}$ at higher frequencies. Depending on the implementation details, this may cause the frequency response of the oscillator 1742 at higher frequencies to the same as, or similar to, the frequency response of the VCO illustrated in FIG. 9. Thus, the frequency response at higher frequencies may have little or no change, and the values of one or more of the charge pump current $I_{CP}$, resistor, and/or capacitors in the loop filter may be left unchanged while maintaining the same or similar loop bandwidth and/or PLL stability.

Although Q1708 in FIG. 17 is illustrated as being implemented with one or more transistors that may be adjusted based on a selection code sel<n:1> for calibration purposes, in other embodiments, any other arrangement for Q1708 (e.g., a fixed geometry and/or number of devices) may be used.

In some embodiments, the control voltage $v_{cont}$ may remain relatively constant, for example, to provide a relatively fixed output frequency $f_{out}$ and/or phase. In some embodiments, the control voltage $v_{cont}$ may be varied (e.g., using a feedback scheme) to provide a variable output frequency $f_{out}$ and/or phase. For example, in an embodiment in which the VCO 1742 may be used to implement a frequency modulation (FM) scheme, the control voltage $v_{cont}$ may be controlled (e.g., modulated by a feedback circuit) to adjust the output frequency $f_{out}$ and/or phase. Thus, some embodiments may control a frequency and/or phase of the control voltage $v_{cont}$, and thus, control a gain of a frequency characteristic of the first current path 1740 and/or the second current path 1741.

Figure 18:
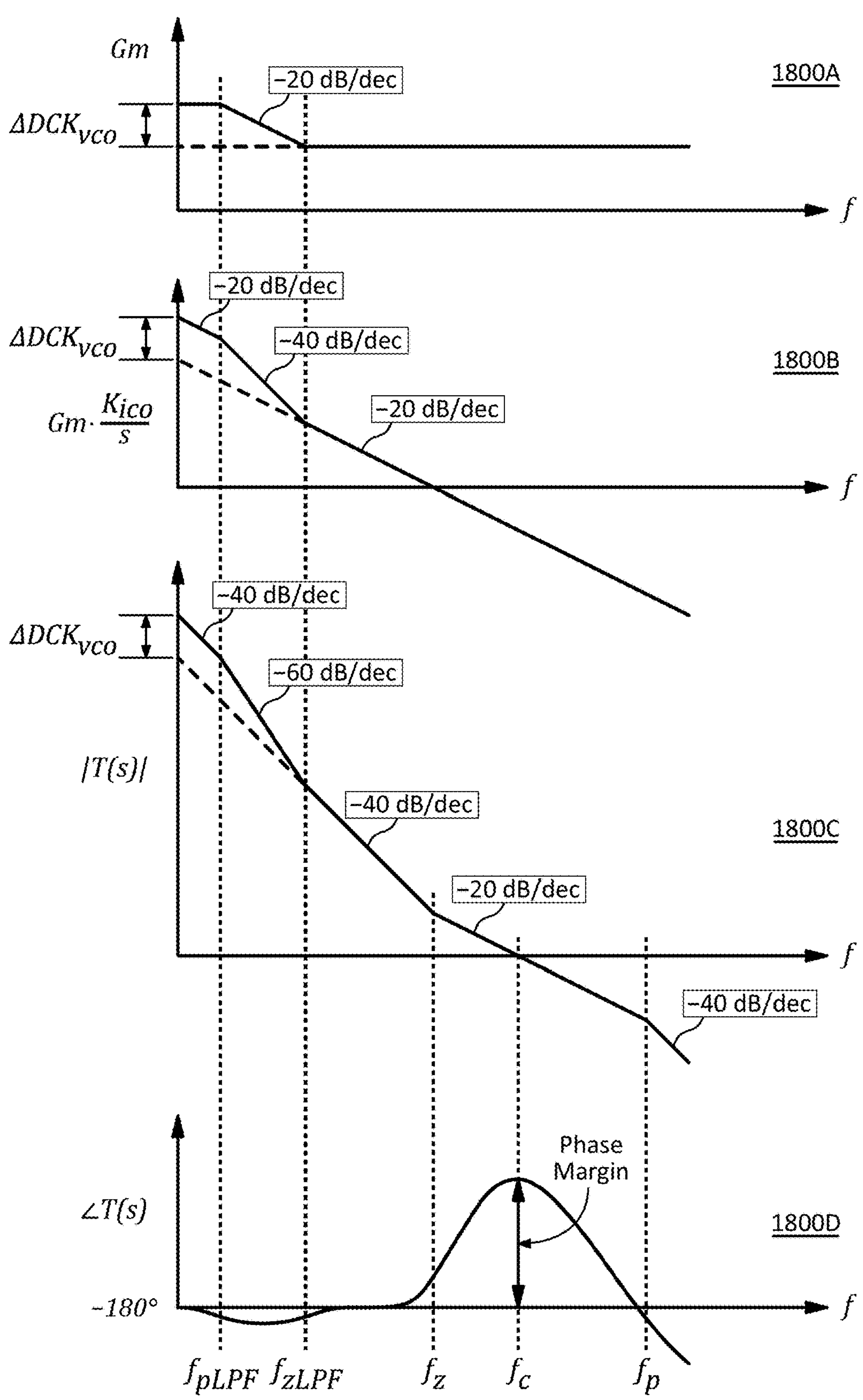
FIG. 18 illustrates example embodiments of frequency response characteristics of a voltage controlled oscillator having a low pass filter as illustrated in FIG. 17 and a phase locked loop in accordance with example embodiments of the disclosure.

FIG. 18 illustrates example embodiments of frequency response characteristics of a voltage controlled oscillator having a low pass filter as illustrated in FIG. 17 and a phase locked loop in accordance with example embodiments of the disclosure. In these example embodiments, a pole and a zero of the low pass filter 1748 may both be below (e.g., well below) the loop bandwidth $f_c$.

Graph 1800A illustrates a curve shown with a solid line of the magnitude of the transconductance $G_m$ of the input stage 1705 and/or current mirror 1735 illustrated in FIG. 17. The low pass filter 1748 may be implemented with a pole at a frequency $f_{pLPF}$ and a zero at a frequency $f_{zLPF}$. For comparison, the corresponding curve from graph 800A in FIG. 8 is shown with a dashed line.

At frequencies between f=0 and $f_{PLPF}$, the contribution from $I_{1708}$ from the DC or low frequency path 1741 may cause the DC or low frequency $G_m$ to increase by an amount $\Delta DCK_{VCO}$. At $f_{PLPF}$, the pole of the low pass filter 1748 may cause the contribution from $I_{1708}$ to gradually decrease, and therefore, the magnitude of $G_m$ may decrease, for example, with a slope of −20 dB/dec. At $f_{zLPF}$, the zero of the low pass filter 1748 may change the slope by +20 dB/dec, and therefore, the $G_m$ may flatten out at a value that may be the same as, or similar to, the value it would have DC or low frequency current path 1741 was removed.

Graph 1800B illustrates a curve shown with a solid line of the magnitude of $G_m$ combined with the magnitude of the frequency response of the gain coefficient $K_{ICO}$ for the current controlled oscillator 1707 illustrated in FIG. 7. For comparison, the corresponding curve from graph 800B in FIG. 8 is shown with a dashed line.

The current controlled oscillator 1707 may integrate the control signal and therefore may contribute a pole at the origin and a slope of −20 dB/dec. Thus, the curve may have an initial slope of −20 dB/dec between f=0 and $f_{pLPF}$, a slope of −40 dB/dec between $f_{PLPF}$ and $f_{ZLPF}$, and a slope of −20 dB/dec at frequencies above $f_{ZLPF}$. The curve shown with a dashed line may illustrate what the curve of $G_m$ would look like if the DC or low frequency current path 1741 was removed.

Graph 1800C illustrates a curve shown with a solid line of the magnitude of the loop gain T(s) of a PLL that may include the VCO 1742 illustrated in FIG. 17. For comparison, the corresponding curve from graph 800C in FIG. 8 is shown with a dashed line.

At frequencies between f=0 and $f_{PLPF}$, the contribution from $I_{1708}$ from the DC or low frequency path 1741 may cause the DC or low frequency $G_m$ to increase by an amount $\Delta DCK_{VCO}$. The initial slope of the curve may be −40 dB/dec due to the two poles at the origin (one from the current controlled oscillator 1707 and one from the capacitor $C_1$ in the loop filter). At $f_{PLPF}$, the pole of the low pass filter 1748 may turn the slope down −60 dB/dec. At $f_{ZLPF}$, the zero of the low pass filter 1748 may turn the slope up to −40 dB/dec.

At $f_z$ (corresponding to $\omega_z$ in Eq. 9), the zero contributed by $R_1$ in the loop filter may turn the slope up (by +20 dB/dec) to −20 dB/dec, and at $f_p$ (corresponding to op in Eq. 9), the second pole contributed by capacitor $C_2$ in the loop filter may turn the slope back down to −40 dB/dec. The crossover frequency $f_c$ (loop bandwidth) may fall between $f_z$ and $f_p$ in a manner similar to the curve illustrated in Graph 800C in FIG. 8.

Graph 1800D illustrates a curve shown with a solid line of the phase of the frequency response of a PLL that may include the VCO 1742 illustrated in FIG. 17.

The initial phase may be −180 degrees at f=0 due to the two poles at the origin. The pole of the low pass filter 1748 may cause a phase shift that may cause the phase to decrease below −180 degrees in a region around the pole frequency $f_{pLPF}$. The zero of the low pass filter 1748 may cause a phase shift that may cause the phase to return to −180 degrees in a region around the zero frequency $f_{zLPF}$. At higher frequencies, the phase of the frequency response may be the same as, or similar to, the embodiment illustrated in graph 800D in FIG. 8. Therefore, the pole and/or zero of the low pass filter 1748 in the DC or low frequency current path 1741 may have little or no effect on the phase margin and/or stability of the PLL as shown in graph 1800D.

Thus, the addition of the DC or low frequency current path 1741 illustrated in FIG. 17 may provide an increased DC or low frequency $K_{VCO}$ and/or loop gain at frequencies below about $f_{zLPF}$, while causing little or no change to the loop dynamics at higher frequencies. Depending on the implementation details, this may enable a PLL including the VCO 1742 to operate at a relatively wider range of frequencies while maintaining loop PLL loop dynamics (e.g., stability).

Figure 19:
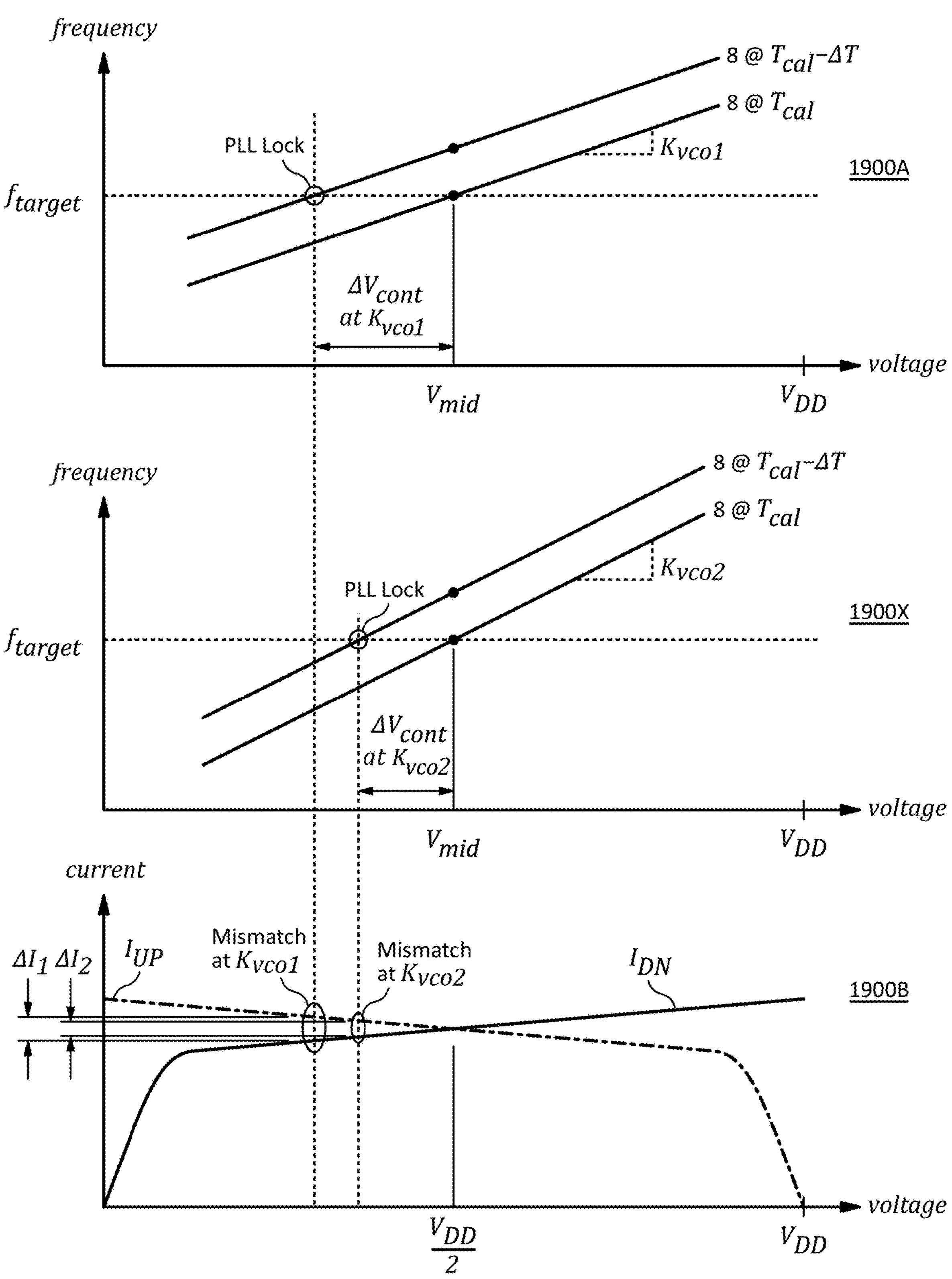
FIG. 19 illustrates example embodiments of a frequency-voltage characteristic of a voltage controlled oscillator and a current-voltage characteristic of a charge pump at a reduced operating temperature in accordance with example embodiments of the disclosure.

FIG. 19 illustrates example embodiments of a frequency-voltage characteristic of the voltage controlled oscillator illustrated in FIG. 17 and a current-voltage characteristic of a charge pump that may be used with the voltage controlled oscillator illustrated in FIG. 17 at a reduced operating temperature in accordance with example embodiments of the disclosure.

For purposes of comparison, graph 1900A in FIG. 19 essentially illustrates a reproduction of graph 1100A in FIG. 11 in which the gain coefficient is indicated as $K_{VCO1}$ which may be determined by the gain coefficient of the VCO 904 illustrated in FIG. 9.

The lower curve shown in graph 1900X illustrates the frequency-voltage characteristic of the VCO 1742 illustrated in FIG. 17 when operating at a temperature $T_{cal}$ at which it was calibrated using a selection code (e.g., 8). The upper curve in graph 1900X illustrates the frequency-voltage characteristic of the VCO 1742 when operating at a lower temperature ($T_{cal}$−ΔT) than it was calibrated at while using the same selection code (e.g., 8) that it was calibrated with. The slope of the curves in graph 1900X is indicated as $K_{VCO2}$ and may be determined by the DC $K_{VCO}$ of the VCO 1742, which may include the contribution from $I_{1708}$ from the DC or low frequency path 1741.

Because $K_{VCO2}$ may be greater than $K_{VCO1}$ (due, for example, to the greater DC $K_{VCO}$ of the VCO 1742), the settled value of $v_{cont}$ when the PLL is locked may be closer to $V_{mid}$ for $K_{VCO2}$ than for $K_{VCO1}$, and therefore, the mismatch in the positive and negative charge pump currents $I_{UP}$ and $I_{DN}$ illustrated in graph 1900B may be lower. For example, as illustrated in graph 1800B, the current mismatch between $I_{UP}$ and $I_{DN}$ may be $\Delta I_1$ for $K_{VCO1}$ and $\Delta I_2$ for $K_{VCO2}$. Thus, depending on the implementation details, the addition of the DC or low frequency current path 1741 illustrated in FIG. 17 may reduce mismatch in a charge pump which in turn may reduce spurs, jitter, phase noise, and/or the like in a PLL. The DC or low frequency current path 1741 may cause a similar reduction in the charge pump currents when the VCO 1742 operates at a higher temperature ($T_{cal}+\Delta T$) than it was calibrated at.

Figure 20:
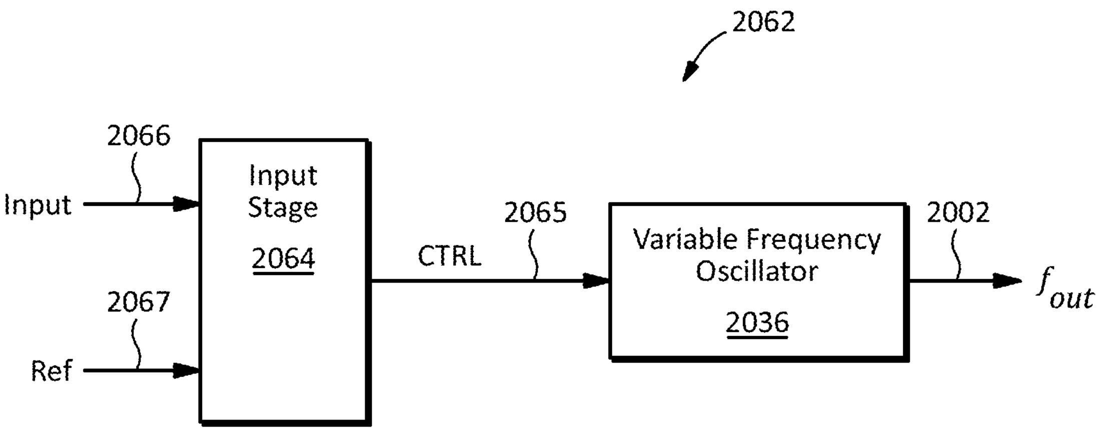
FIG. 20 illustrates an embodiment of an oscillator having an input stage in accordance with example embodiments of the disclosure.

FIG. 20 illustrates an embodiment of an oscillator having an input stage in accordance with example embodiments of the disclosure. The oscillator 2062 illustrated in FIG. 20 may include an input stage 2064 and/or a variable frequency oscillator 2036. The variable frequency oscillator 2036 may generate an output signal 2002 having a frequency $f_{out}$ based on a control signal (CTRL) 2065. The input stage 2064 may be configured to generate the control signal 2065 based on a comparison of an input signal 2066 and a reference signal 2067. For example, the input stage 2064 may be implemented with a differential circuit that may generate the control signal 2065 based on a difference between the input signal 2066 and the reference signal 2067.

Depending on the implementation details, the use of an input stage 2064 that may operate based on a comparison of two signals may enable the input signal 2066 to be maintained at a voltage that may be beneficial for a preceding stage. For example, if the oscillator 2062 illustrated in FIG. 20 is used in a PLL, the input stage 2064 may operate to maintain the voltage of the input signal 2066 at a voltage (e.g., a midpoint of a power supply) at which a charge pump that may drive the input signal 2066 may generate relatively matched positive and negative output currents.

Figure 21:
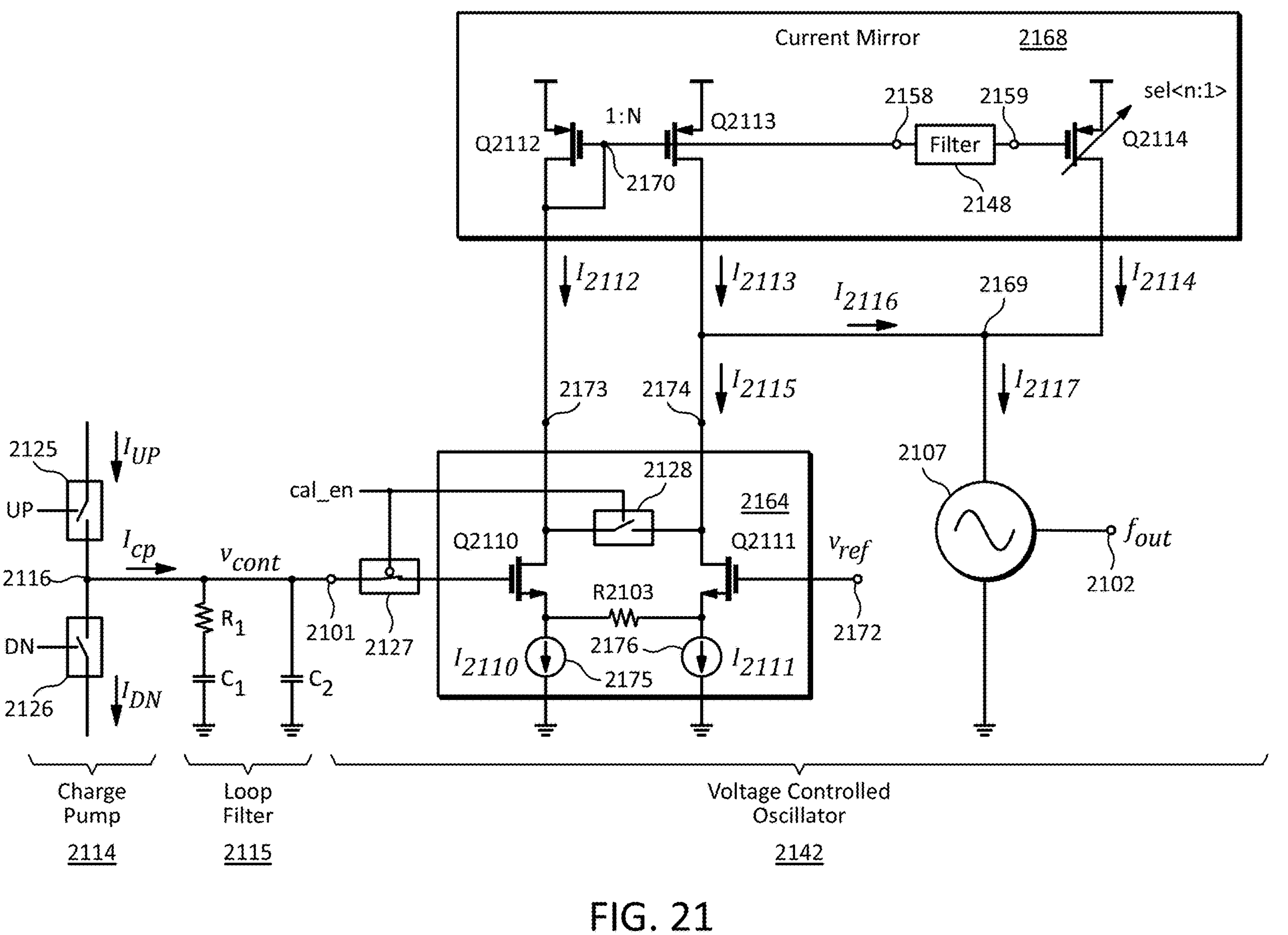
FIG. 21 illustrates an example embodiment of a voltage controlled oscillator having an input stage in accordance with example embodiments of the disclosure.

FIG. 21 illustrates an example embodiment of a voltage controlled oscillator having an input stage in accordance with example embodiments of the disclosure. The VCO 2142 illustrated in FIG. 21 may include an input stage 2164 having differential inputs arranged in a configuration that, depending on the implementation details, may be characterized as pseudo-differential. The VCO 2142 may also include a current mirror 2168 having first and second current paths with first and second frequency responses, respectively. Moreover, the input stage 2164 and the current mirror 2168 may be integrated in a manner that, depending on the implementation details, may produce synergistic results.

The input stage 2164 may include a first input transistor Q2110 having a gate connected to receive an input signal $v_{cont}$ at node 2101, a source connected to a first power supply (e.g., ground or GND) through a first bias current generator 2175 that may generate a first bias current $I_{2110}$, and a drain connected to a node 2173. The input stage 2164 may also include a second input transistor Q2111 having a gate connected to receive an input signal $v_{ref}$ at node 2172, a source connected to the first power supply (e.g., ground or GND) through a second bias current generator 2176 that may generate a second bias current $I_{2111}$, and a drain connected to a node 2174. A degeneration resistor R2103 may be connected between the sources of Q2110 and Q2111.

In some embodiments, and depending on the implementation details, transistors Q2110 and Q2111 may be characterized as a differential pair of input transistors (e.g., a differential $G_m$ pair) that may receive a differential input signal at node 2101 (e.g., a positive input) and node 2172 (e.g., a negative input) and provide a differential output at nodes 2173 and 2174. Depending on the implementation details, input stage 2164 may be characterized as pseudo-differential because the positive input signal $v_{cont}$ may operate as a single-ended signal whereas the negative input may be connected to a stable reference signal $v_{ref}$. Thus, during operation (e.g., in a PLL that may use the VCO 2142), the value of the input signal $v_{cont}$ may vary as the PLL control loop acquires and/or maintains lock a condition, whereas the reference signal $v_{ref}$ may remain at a constant voltage.

However, although the input signal $v_{cont}$ may vary, the transconductance (e.g., gain) of Q2110 and Q2111 may cause $v_{cont}$ to vary by only a relatively small amount from $v_{ref}$. For example, if the transconductance of Q2110 and Q2111 is set to a relatively high value, it may also cause the DC or relatively low frequency gain coefficient of the VCO 2142 to be relatively high. Thus, with $v_{ref}$ maintained at a stable voltage such as the midpoint of a power supply voltage $V_{DD}$ (e.g., $V_{mid}=V_{DD}/2$), the input stage 2164 may cause (e.g., force) $v_{cont}$ to remain relatively close to $v_{ref}$. This may cause an output terminal of a charge pump that may drive $v_{cont}$ to remain close to $v_{ref}$ which may be set to a voltage (e.g., $V_{mid}$) at which the positive and negative outputs of the charge pump may be relatively closely matched.

In some embodiments, and depending on the implementation details, the use of currents $I_{2110}$ and/or $I_{2111}$ to bias transistors Q2110 and/or Q2111 may provide a relatively high power supply rejection ratio (PSRR), for example, due to the relatively high impedance of the current sources 2175 and/or 2176. Additionally, or alternatively, the value of degeneration resistor R2103 may be varied to vary the transconductance of Q2110 and/or Q2111. Moreover, depending on the implementation details, the value of R2103 may be varied with little or no effect on the bias currents $I_{2110}$ and/or $I_{2111}$.

The differential pair of transistors Q2110 and Q2111, the degeneration resistor R2103, and the bias current sources 2175 and/or 2176 are shown for purposes of illustration in the example embodiment illustrated in FIG. 21, but other types of differential amplifiers, degeneration, and/or biasing arrangements may be used.

The output nodes 2173 and 2174 of the input stage 2164 may be connected to the drains of transistors Q2112 and Q2113, respectively, which, depending on the implementation details, may synergistically perform multiple functions. First, transistors Q2112 and Q2113 may form a current mirror load that may convert a differential output of the input stage 2164 to a single-ended current $I_{2116}$ which may provide a relatively high frequency component of the current $I_{2117}$ that may control the output frequency $f_{out}$ of the current controlled oscillator 2107. Second, transistors Q2112 and Q2113 may generate a voltage at node 2170 that may drive the gate of another mirror transistor Q2114 through a filter (e.g., a low pass filter) 2148. Depending on the implementation details, this may cause Q2114 to generate a relatively low frequency component $I_{2114}$ of the current $I_{2117}$ that may drive the current controlled oscillator 2107. Currents $I_{2114}$ and $I_{2116}$ may be combined, for example, by summing at node 2169.

In some embodiments, transistor Q2113 may be characterized as a first current path having a first frequency characteristic, and filter 2148 and transistor Q2114 may be characterized as a second current path having a second frequency characteristic. Depending on the implementation details, this may enable frequency response shaping of the VCO 2142 and/or another system (e.g., a PLL) in which the VCO 2142 may be used, for example, in a manner similar to that described with respect to FIG. 17 and FIG. 18.

Thus, the arrangement of the current mirror 2168 may enable the input stage 2164 to maintain (e.g., control) the input signal $v_{cont}$ at a level that may improve the matching of charge pump currents while also implementing current paths having frequency responses that may increase the $K_{VCO}$ of the oscillator at relatively low frequencies, maintain stable PLL operation at relatively high frequencies, and/or increase the operating frequency range of a PLL.

In some embodiments, transistor Q2114 may be used to calibrate the VCO 2142, for example, using one or more selection codes as described above. However, in some embodiments, and depending on the implementation details, the use of an input stage based on signal comparisons (e.g., a differential or pseudo-differential input stage) may enable the VCO 2142 and/or a PLL or other system in which the VCO 2142 to operate without calibration, for example, for one or more PVT values. In such an embodiment, even if no PVT calibration is used, transistor Q2114 may be implemented to provide an adjustable current $I_{2114}$ which may be used for frequency calibration and/or frequency range adjustment, selection, and/or the like. In a calibration operation, the node 2101 may be disconnected from a loop filter, charge pump, and/or any other source of the input signal $v_{cont}$ it may be connected to (e.g., using a first switch controlled by a calibration enable signal cal_en), and the differential inputs at nodes 2101 and 2172 may be connected together (e.g., using a second switch controlled by the calibration enable signal cal_en).

In some embodiments, and depending on the implementation details, the use of an input stage that may operate based on a comparison of two input signals (e.g., a differential or pseudo-differential input stage that may operate based on the difference between an input signal and a reference signal as illustrated in FIG. 21) may enable a transconductance of the input stage to be adjusted by varying the values of one or more degeneration resistors, bias current sources, and/or the like. Moreover, depending on the implementation details, such adjustments to one or more degeneration resistors may be made without affecting one or more bias currents. Additionally, or alternatively, an embodiment such as that illustrated in FIG. 21 may provide a relatively high PSRR and/or improved flexibility in the selection of one or more degeneration resistors.

Figure 22:
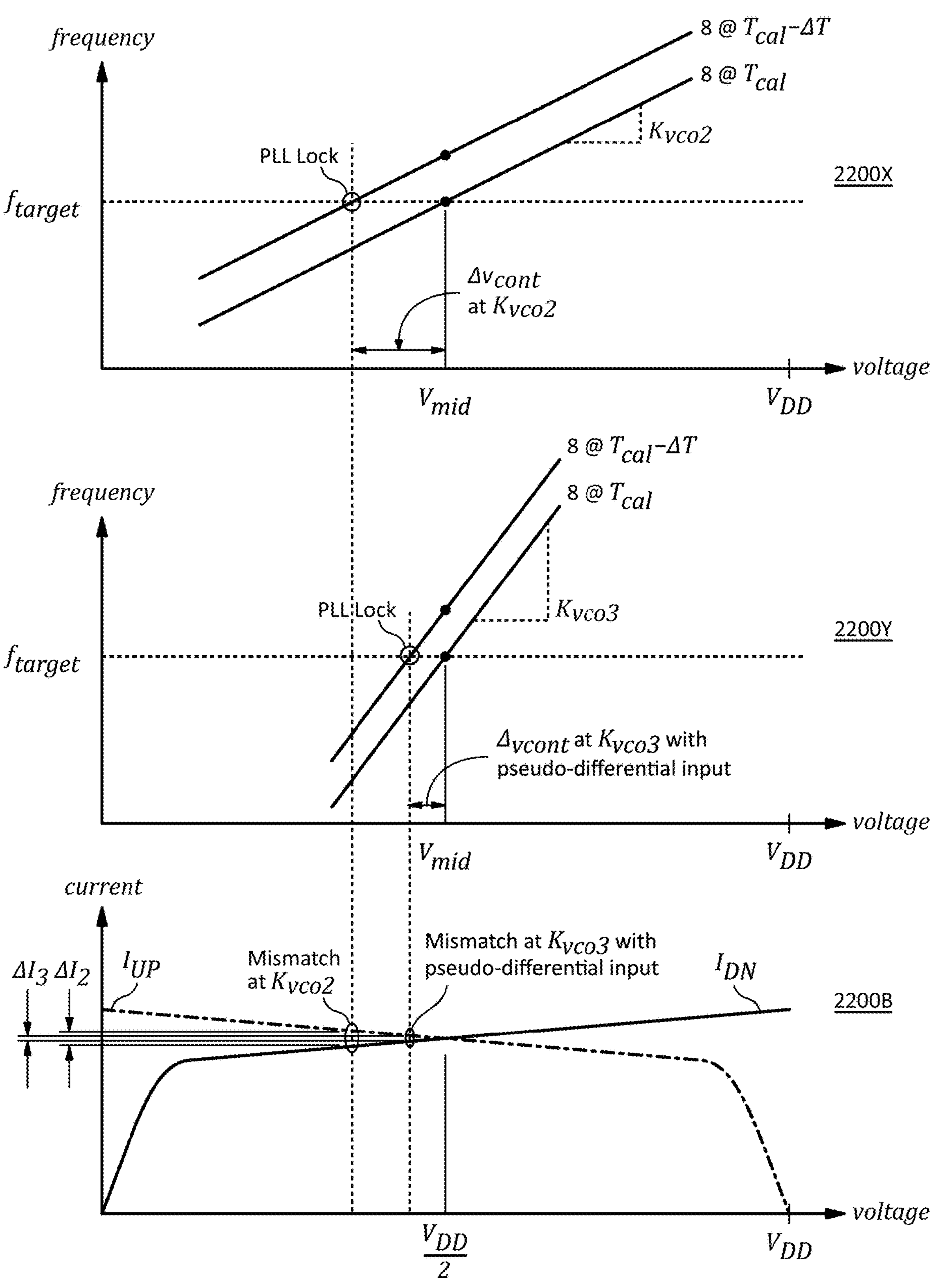
FIG. 22 illustrates example embodiments of a frequency-voltage characteristic of the voltage controlled oscillator and a current-voltage characteristic of a charge pump at a reduced operating temperature in accordance with example embodiments of the disclosure.

FIG. 22 illustrates example embodiments of a frequency-voltage characteristic of the voltage controlled oscillator illustrated in FIG. 21 and a current-voltage characteristic of a charge pump that may be used with the voltage controlled oscillator illustrated in FIG. 21 at a reduced operating temperature in accordance with example embodiments of the disclosure.

For purposes of comparison, graph 2200X in FIG. 22 essentially illustrates a reproduction of graph 1900X in FIG. 19 in which the gain coefficient indicated as $K_{VCO2}$ may be determined by the gain coefficient of the VCO 1742 illustrated in FIG. 17.

The lower curve shown in graph 1900Y illustrates the frequency-voltage characteristic of the VCO 2142 illustrated in FIG. 21 when operating at a temperature $T_{cal}$ at which it was calibrated using a selection code (e.g., 8). The upper curve in graph 2200Y illustrates the frequency-voltage characteristic of the VCO 2142 when operating at a lower temperature ($T_{cal}$−ΔT) than it was calibrated at while using the same selection code (e.g., 8) that it was calibrated with. The slope of the curves in graph 2200Y is indicated as $K_{VCO3}$ and may be determined by the DC $K_{VCO}$ of the VCO 2142, which may include the contribution from $I_{2114}$ from transistor Q2114 which may be part of a DC or low frequency current path that may include the low pass filter 2148.

Because $K_{VCO3}$ may be greater than $K_{VCO2}$ (due, for example, to the greater DC $K_{VCO}$ of the VCO 2142), the settled value of $v_{cont}$ when the PLL is locked may be closer to $V_{mid}$ for $K_{VCO3}$ than for $K_{VCO2}$, and therefore, the mismatch in the positive and negative charge pump currents $I_{UP}$ and $I_{DN}$ illustrated in graph 2200B may be lower. Thus, in some embodiments, the use of the input stage 2164 (e.g., a pseudo-differential input stage) illustrated in FIG. 21 may reduce mismatch in a charge pump which in turn may reduce spurs, jitter, phase noise, and/or the like in a PLL. Moreover, depending on the implementation details, the use of a pseudo-differential input stage may reduce charge pump mismatch to an extent that one or more calibration operations (e.g., calibration for PVT values) may be eliminated. The use of the input stage 2164 may cause a similar reduction in the charge pump currents when the VCO 2142 operates at a higher temperature ($T_{cal}$+ΔT) than it was calibrated at.

Figure 23:
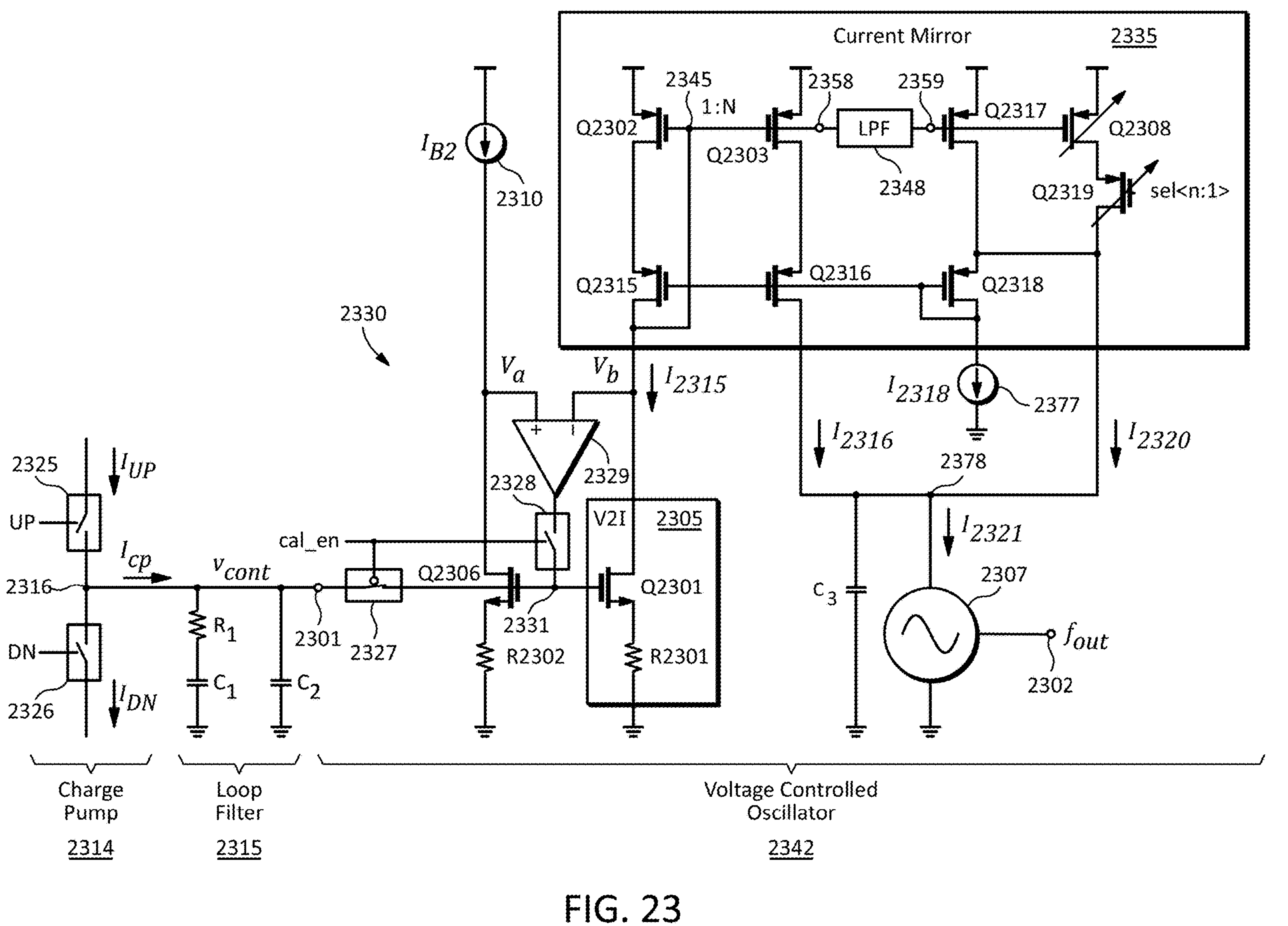
FIG. 23 illustrates an embodiment of a voltage controlled oscillator having one or more frequency characteristics and a cascode scheme in accordance with example embodiments of the disclosure.

FIG. 23 illustrates an embodiment of a voltage controlled oscillator having one or more frequency characteristics and a cascode scheme in accordance with example embodiments of the disclosure. In some aspects the VCO 2342 illustrated in FIG. 23 may be similar to the embodiment illustrated in FIG. 17 in which similar elements may be indicated by reference numbers ending in, and/or containing, the same digits, letters, and/or the like. The embodiment illustrated in FIG. 23, however, may include a pseudo-cascode arrangement including transistors Q2315, Q2316, Q2317, Q2318, and/or Q2319 and/or current source 2377. Depending on the implementation details, the filter 2348 may be implemented with a low pass filter (LPF) as illustrated in FIG. 23 that may cause the current $I_{2320}$ may provide a DC or relatively low frequency component to the current $I_{2321}$ based on the input signal $v_{cont}$ at terminal 2301, whereas the current $I_{2316}$ (which may be combined with $I_{2320}$ at summing node 2378) may provide an AC or relatively high frequency component to the current $I_{2321}$ based on the input signal $v_{cont}$ at terminal 2301.

Additionally, or alternatively, transistor Q2319 may be configured to provide a calibration component to the current $I_{2320}$, for example, based on a selection code sel<n:1>.

Figure 24:
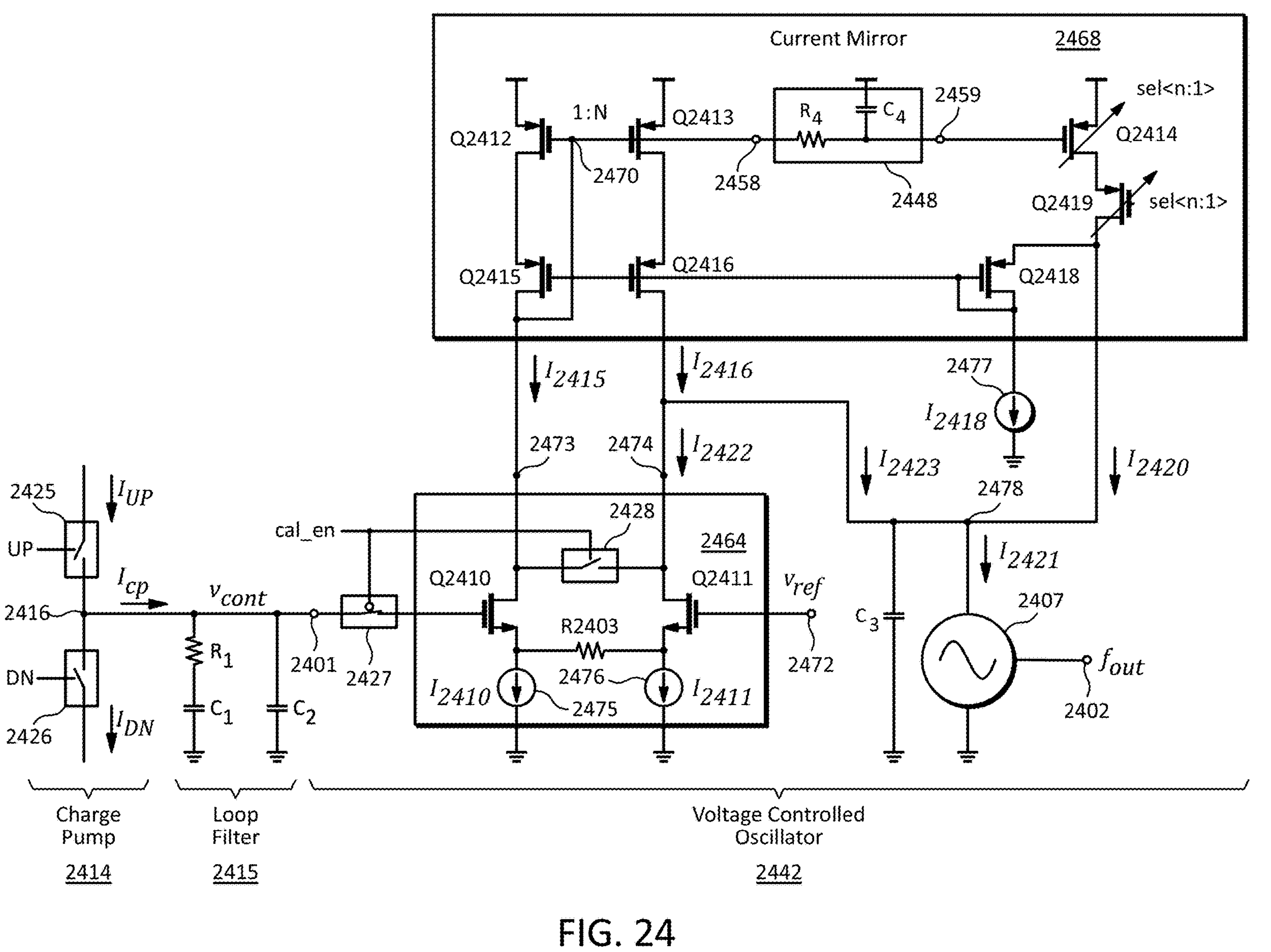
FIG. 24 illustrates an embodiment of a voltage controlled oscillator having one or more frequency characteristics and a cascode scheme in accordance with example embodiments of the disclosure.

FIG. 24 illustrates an embodiment of a voltage controlled oscillator having one or more frequency characteristics and a cascode scheme in accordance with example embodiments of the disclosure. In some aspects the VCO 2442 illustrated in FIG. 24 may be similar to the embodiment illustrated in FIG. 21 in which similar elements may be indicated by reference numbers ending in, and/or containing, the same digits, letters, and/or the like. The embodiment illustrated in FIG. 24, however, may include a pseudo-cascode arrangement including transistors Q2415, Q2416, Q2418, and/or Q2419 and/or current source 2477. Depending on the implementation details, the current $I_{2420}$ may provide a DC or relatively low frequency component to the current $I_{2421}$ based on the input signal $v_{cont}$ at terminal 2401, whereas the current $I_{2423}$ (which may be combined with $I_{2420}$ at summing node 2478) may provide an AC or relatively high frequency component to the current $I_{2421}$ based on the input signal $v_{cont}$ at terminal 2401.

Additionally, or alternatively, transistor Q2419 may be configured to provide a calibration component to the current $I_{2420}$, for example, based on a selection code sel<n:1>.

In some embodiments, the filter 2448 may be implemented with an example embodiment of a low pass RC filter as illustrated in FIG. 24. For example, a capacitor $C_4$ may have a first terminal connected to a power supply voltage (e.g., $V_{DD}$) and a second terminal connected to the gate of transistor Q2414 (e.g., at node 2459), and a resistor R4 may have a first terminal connected to the gates of transistors Q2412 and Q2413 (at node 2458) and a second terminal connected to the second terminal of capacitor $C_4$.

The example embodiment of the low pass filter 2448 may be used in any of the embodiments disclosed herein. Other examples of filters that may be used herein may include any combination of passive components (e.g., resistors, capacitors, inductors, and/or the like) and/or active components (e.g., transistors, op amps, and/or the like) having any frequency characteristics (e.g., real and/or complex poles, zeros, and/or the like) that may enable frequency response shaping of one or more signal paths, signal, and/or the like.

Figure 25:
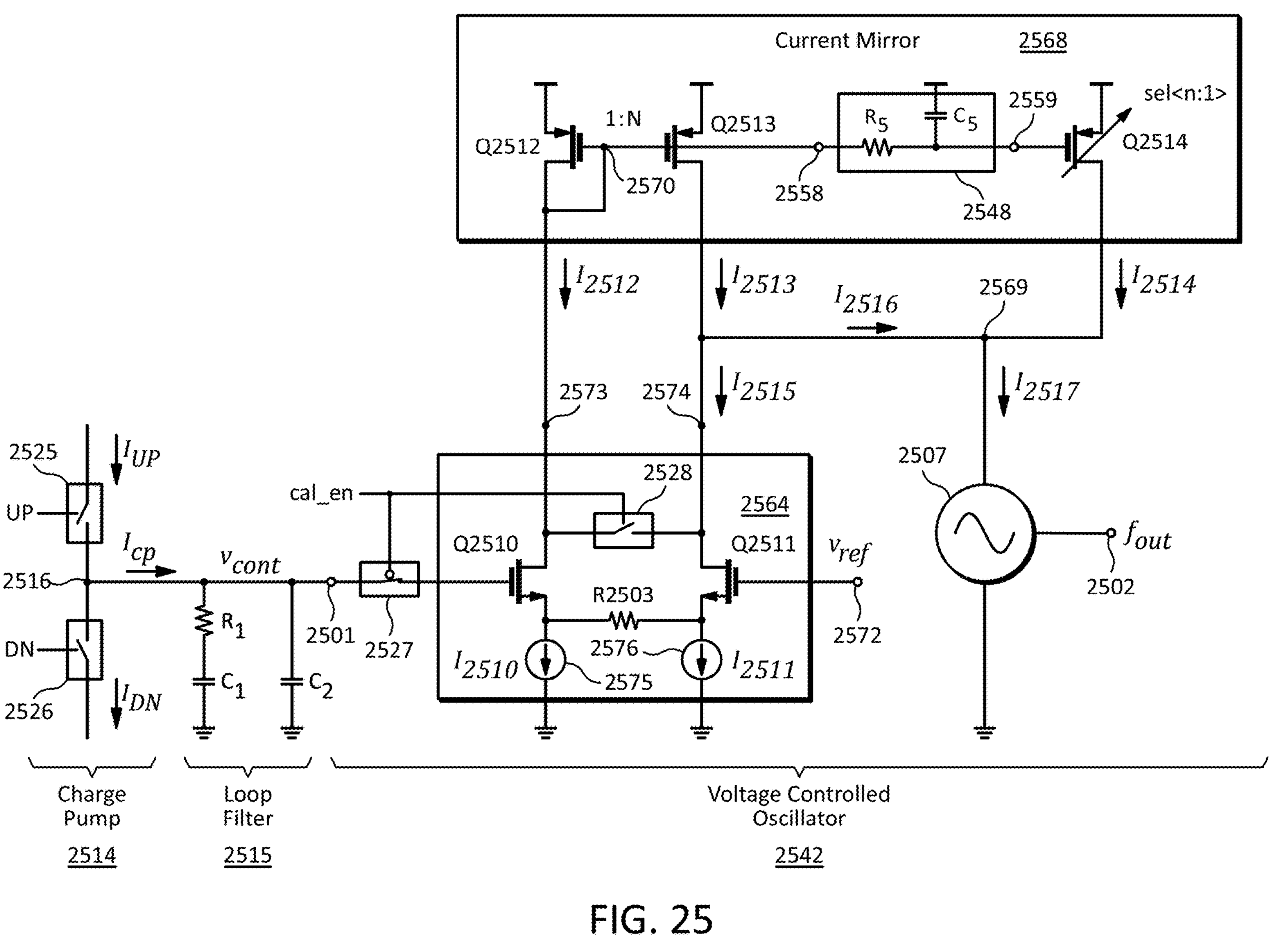
FIG. 25 illustrates an example embodiment of low pass filter having a capacitor and a resistor in accordance with example embodiments of the disclosure.

FIG. 25 illustrates an example embodiment of low pass filter having a capacitor and a resistor in accordance with example embodiments of the disclosure. For purposes of illustration, the low pass filter 2548 may be shown in the context of a VCO 2542 similar to the embodiment illustrated in FIG. 21 in which similar elements may be indicated by reference numbers ending in, and/or containing, the same digits, letters, and/or the like. However, the low pass filter 2548 may be used in any other type oscillator in accordance with example embodiments of the disclosure.

Referring to FIG. 25, the low pass filter 2548 may include a capacitor $C_5$ may have a first terminal connected to a power supply voltage (e.g., $V_{DD}$) and a second terminal connected to the gate of transistor Q2514 (e.g., at node 2559), and a resistor $R_5$ may have a first terminal connected to the gates of transistors Q2512 and Q2513 (at node 2558) and a second terminal connected to the second terminal of capacitor $C_5$.

In some embodiments, the first terminal of $C_5$ may be connected to a power supply voltage (for example, $V_{DD}$ as illustrated in FIG. 25) because this may cause the gate of Q2514 to follow fluctuations in the power supply voltage, thereby reducing or eliminating current flow through $C_5$ (and therefore voltage fluctuations at the gate of Q2514) caused by fluctuations in the power supply voltage. Depending on the implementation details, this may improve a power supply rejection ratio (PSRR) associated with some or all of the VCO 2542.

In some embodiments, the low pass filter 2548 may be implemented with a relatively low frequency pole, for example, at a frequency $f_{pLPF}$ that may be below (e.g., well below) a crossover frequency $f_c$, (e.g., loop bandwidth) as illustrated in FIG. 18. In some embodiments, implementing the low pass filter 2548 with a relatively low frequency pole may involve using a resistor $R_5$ and/or a capacitor $C_5$ having relatively large values of resistance and/or capacitance, respectively. For example, in some embodiments, an RC filter may have a pole at a frequency $f_{pole}$ (e.g., −3 dB frequency) that may be given by $$f_{pole} = \frac{1}{2\pi R_5 C_5}. \quad \text{(Eq. 10)}$$

Thus, depending on the implementation details, implementing the low pass filter with a relatively low frequency pole may involve using a relatively large resistor and/or capacitor which may take up a relatively large area on an integrated circuit (IC).

Figure 26:
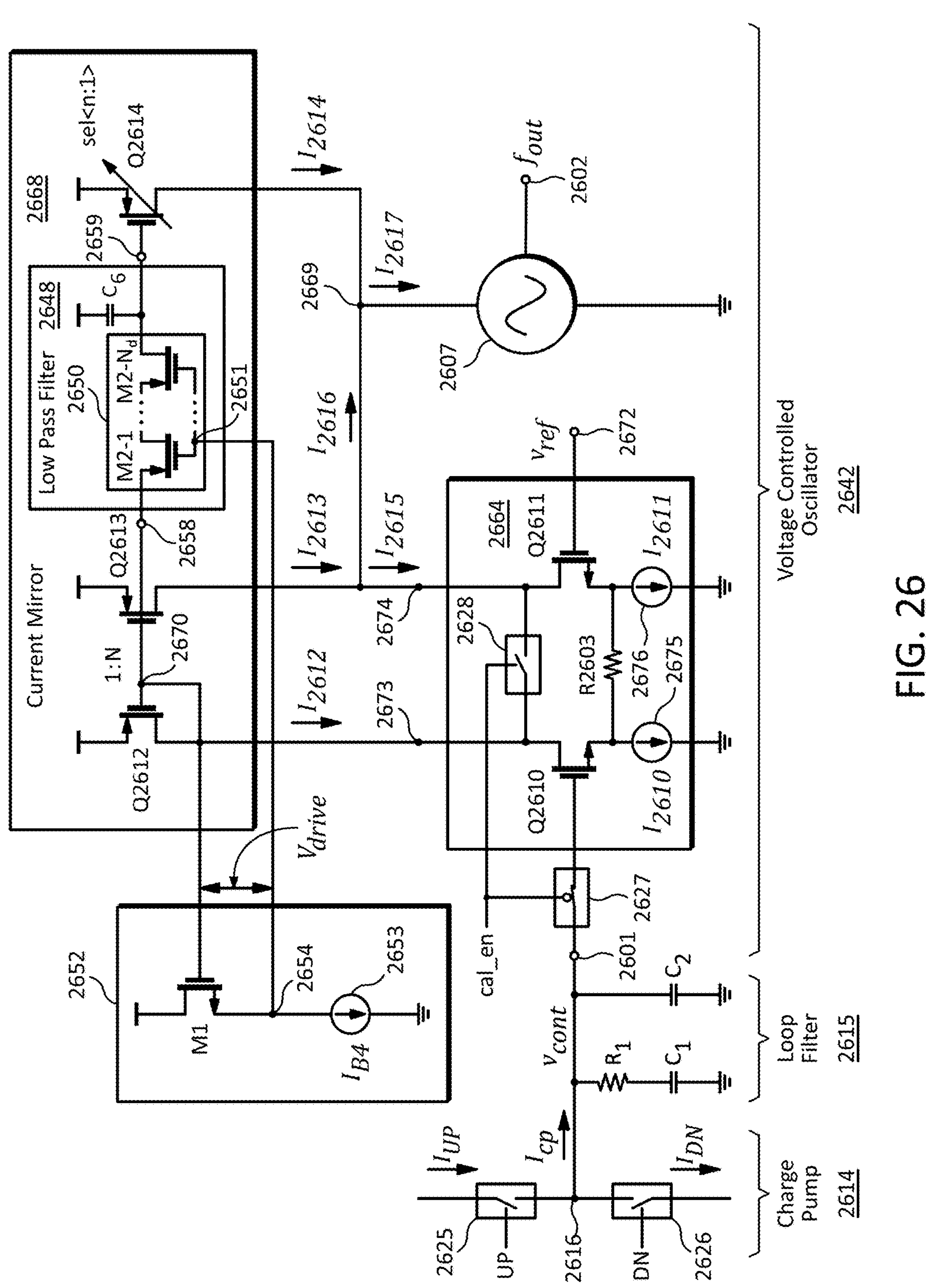
FIG. 26 illustrates an example embodiment of low pass filter having a capacitor and a resistor based on one or more electronically controllable devices in accordance with example embodiments of the disclosure.

FIG. 26 illustrates an example embodiment of low pass filter having a capacitor and a resistor based on one or more electronically controllable devices in accordance with example embodiments of the disclosure. For purposes of illustration, the low pass filter 2648 may be shown in the context of a VCO 2642 similar to the embodiment illustrated in FIG. 21 in which similar elements may be indicated by reference numbers ending in, and/or containing, the same digits, letters, and/or the like. However, the low pass filter 2648 may be used in any other type oscillator in accordance with example embodiments of the disclosure.

In the embodiment illustrated in FIG. 26, the low pass filter 2648 may include a resistor 2650 having a value $R_6$ that may be implemented with one or more electronically controllable devices such as one or more transistors M2-1, M2-2, . . . , M2-Nd (which may be referred to collectively and/or individually as transistor M2) where Nd may indicate the number of devices. Transistor M2 may be implemented, for example, with one or more metal oxide semiconductor field effect transistors (MOSFETs) that may be connected in series (e.g., stacked) and configured to operate in a triode region (which may also be referred to as a linear region) in which the transistor may operate as a variable resistor with the drain-to-source (e.g., channel) on resistance $R_{on}$ varying based on the gate-to-source voltage ($V_{GS}$).

As illustrated in FIG. 26, transistor M2-1 may have a source connected to a gate of Q2613 at node 2658, a gate connected to a node 2671, and a drain connected to either a source of the next series connected transistor (e.g., M2-2) or the gate of Q2614 at node 2659. The gates of the one or more next series connected transistors M2-1, M2-2, . . . , M2-Nd may be connected together at node 2671.

A gate drive circuit 2672 may include a transistor M1 and/or current source 2673. Transistor M1 may have a drain connected to a first power supply voltage (e.g., $V_{DD}$), a gate connected to the gates of Q2612 and Q2613 node 2670, and a source connected to a current source 2672 at node 2674 to receive a bias current $I_{B4}$. The current source 2672 may be connected between node 2674 and a second power supply voltage (e.g., ground or GND).

The gate drive circuit 2672 may generate a gate drive voltage $V_{drive}$ between the gate of M1 at node 2670 and the source of M1 at node 2674. The gate drive voltage may be applied to the gates of transistors M2-1, M2-2, . . . , M2-Nd between node 2658 and 2671 to cause the transistors M2-1, M2-2, . . . , M2-Nd to operate as resistors (e.g., in a triode region of one or more of the transistors M2-1, M2-2, . . . , M2-Nd).

Figure 27:
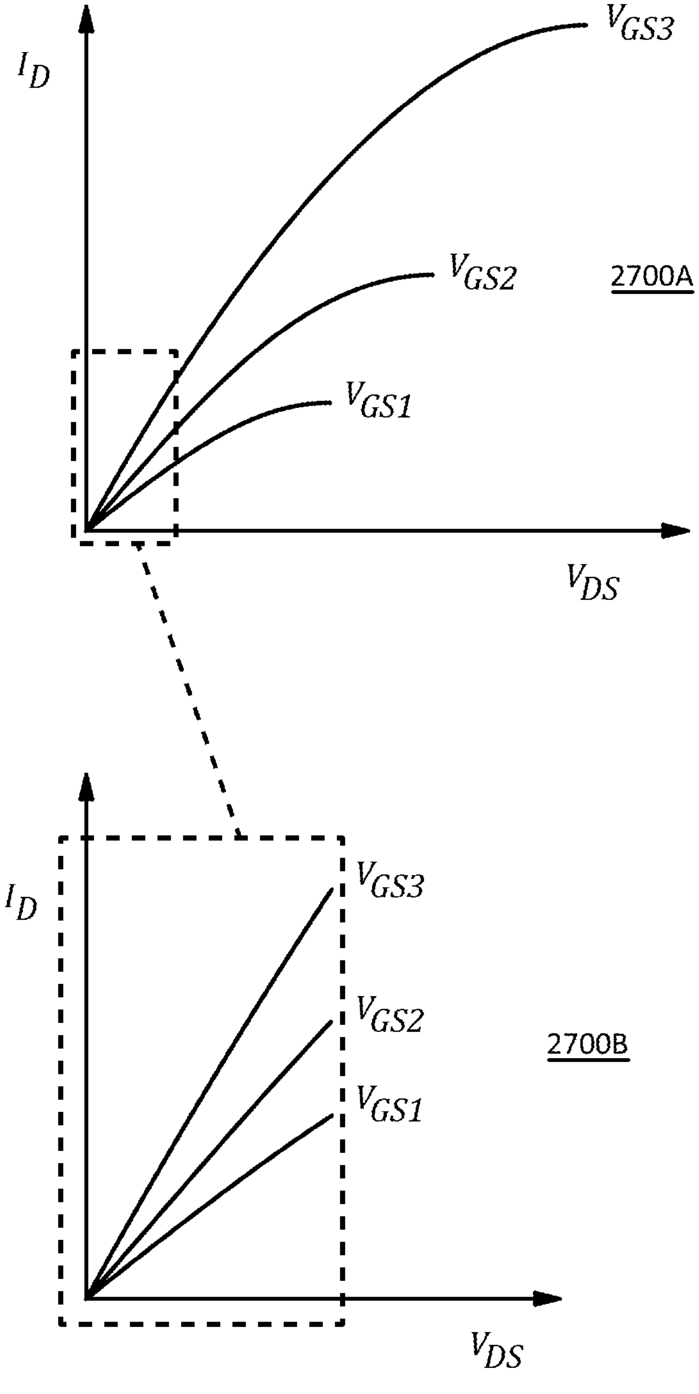
FIG. 27 illustrates some example operating characteristics of an embodiment of a transistor operating in a triode region in accordance with example embodiments of the disclosure.

FIG. 27 illustrates some example operating characteristics of an embodiment of a transistor operating in a triode region in accordance with example embodiments of the disclosure. Graph 2700A illustrates curves of drain current $I_D$ vs. drain-to-source voltage $V_{DS}$ for three different values of $V_{GS}$ indicated as $V_{GS1}$, $V_{GS2}$, and $V_{GS3}$. Each of the curves may have a relatively linear region that may begin at a relatively low value of $V_{DS}$ and increase at a relatively linear rate for increasing values of $V_{DS}$ until the curve becomes nonlinear, for example, as the transistor begins to operate in a saturation region.

Graph 2700B illustrates an enlarged view of a region of graph 2700A where the curves indicated as $V_{GS1}$, $V_{GS2}$, and $V_{GS3}$ may be most linear. For a given value of $V_{GS}$, a change in the value of $V_{DS}$ may be associated with a proportional change in the value of $I_D$, and thus, the channel of the transistor may effectively operate as a linear resistor. Depending on the implementation details, the slope of the curve may determine the resistance. For example, a curve for lower values of $V_{GS}$ (e.g., $V_{GS1}$) may have a lower slope and corresponding higher resistance.

In some embodiments, the resistance $R_{on}$ of a transistor operating in a triode region may be determined as follows:

$$R_{on} = \frac{1}{\mu_n C_{ox} \frac{W}{L}(V_{GS} - V_{TH})} \quad \text{(Eq. 11)}$$

where $\mu_n$ may represent a charge carrier mobility (e.g., $\mu_n$ may represent an electron mobility and/or $\mu_p$ may represent a hole mobility which may be relevant to different device types such as NMOS and/or PMOS transistors), $C_{ox}$ may represent a capacitance per unit area of a gate oxide layer, W may represent a channel width, L may represent a channel length, and/or $V_{TH}$ may represent a threshold voltage of the transistor.

As illustrated by Eq. 11, in some embodiments, the resistance $R_{on}$ may be increased by one or more of: increasing the channel width W, decreasing the channel length L, and/or reducing the value of $V_{GS}-V_{TH}$, for example, by decreasing the threshold voltage $V_{TH}$.

Referring to FIG. 26, in some embodiments, the gate drive voltage $V_{drive}$ generated by M1 in the gate drive circuit 2672 and applied to the gates of M2-1, M2-2, . . . , M2-Nd at node 2671 may depend on one or more parameters such as the geometry and/or process values of M1, the value of the bias current $I_{B4}$, and/or the like. Moreover, one or more of these parameters may be adjusted to adjust the corresponding resistance $R_6$ of resistor 2650. Depending on the implementation details, this may adjust a pole of the low pass filter 2648.

For example, to reduce the frequency of the pole $f_{pole}$ given by Eq. 10, the resistance $R_{on}$ given by Eq. 11 may be increased by decreasing the threshold voltage $V_{TH}$. Depending on the implementation details, this may be accomplished, for example, by increasing the number of transistors Nd, and/or increasing the width of transistor M1 (which may reduce $V_{GS}$).

Some embodiments disclosed above have been described in the context of various implementation details, but the principles of this disclosure are not limited to these or any other specific details. For example, some functionality has been described as being implemented by certain components, but in other embodiments, the functionality may be distributed between different systems and components in different locations and having various user interfaces. Certain embodiments have been described as having specific processes, operations, etc., but these terms also encompass embodiments in which a specific process, operation, etc. may be implemented with multiple processes, operations, etc., or in which multiple processes, operations, etc. may be integrated into a single process, step, etc. A reference to a component or element may refer to only a portion of the component or element. For example, a reference to a block may refer to the entire block or one or more subblocks. The use of terms such as "first" and "second" in this disclosure and the claims may only be for purposes of distinguishing the elements they modify and may not indicate any spatial or temporal order unless apparent otherwise from context. In some embodiments, a reference to an element may refer to at least a portion of the element, for example, "based on" may refer to "based at least in part on," and/or the like. A reference to a first element may not imply the existence of a second element. The principles disclosed herein have independent utility and may be embodied individually, and not every embodiment may utilize every principle. However, the principles may also be embodied in various combinations, some of which may amplify the benefits of the individual principles in a synergistic manner. The various details and embodiments described above may be combined to produce additional embodiments according to the inventive principles of this patent disclosure.

In some embodiments, a portion of an element may refer to less than, or all of, the element. A first portion of an element and a second portion of the element may refer to the same portions of the element. A first portion of an element and a second portion of the element may overlap (e.g., a portion of the first portion may be the same as a portion of the second portion).

Since the inventive principles of this patent disclosure may be modified in arrangement and detail without departing from the inventive concepts, such changes and modifications are considered to fall within the scope of the following claims.

The invention claimed is:

1. A method comprising:

generating, using an oscillator, a first signal having a frequency based on a current;

generating, based on a second signal, a first portion of the current, the first portion of the current having a first frequency characteristic; and generating, based on the second signal, a second portion of the current, the second portion of the current having a second frequency characteristic; and controlling, using a calibration input circuit, a magnitude of at least one of the first portion of the current or the second portion of the current, wherein the calibration input circuit includes a differential circuit.

2. The method of claim 1 further comprising:

controlling a frequency of the first signal by controlling an operating frequency of the oscillator; and controlling, based on the frequency of the first signal, a gain of the first frequency characteristic.

3. The method of claim 1 wherein the first frequency characteristic comprises:

a first gain at a first frequency of the first frequency characteristic; and a second gain at a second frequency of the first frequency characteristic.

4. The method of claim 3 wherein:

the first gain is greater than the second gain; and the second frequency is greater than the first frequency.

5. The method of claim 1 further comprising:

controlling a phase response of the first frequency characteristic as a function of frequency; and controlling, based on the phase response of the first frequency characteristic, a gain of the first frequency characteristic.

6. The method of claim 1 wherein the first frequency characteristic comprises:

a first phase shift at a first frequency; and a second phase shift at a second frequency.

7. The method of claim 6 wherein:

the first phase shift is in a first direction; and the second phase shift is in a second direction.

8. A circuit comprising:

an oscillator configured to generate a first signal having a frequency based on a current; and a current generator configured to generate the current;

wherein the current generator comprises:

a first path configured to generate, based on a second signal, a first portion of the current, the first path having a first frequency characteristic; and a second path configured to generate, based on the second signal, a second portion of the current, the second path having a second frequency characteristic;

and further comprising a calibration input circuit configured to control a contribution of at least one of the first portion of the current or the second portion of the current, wherein the calibration input circuit comprises a differential circuit.

9. The circuit of claim 8, wherein:

the first path comprises a first transistor configured to generate, based on the second signal, the first portion of the current; and the second path comprises a second transistor configured to generate, based on the second signal, the second portion of the current.

10. The circuit of claim 9, wherein the second path comprises a filter configured to control, based on the second signal, the second transistor.

11. The circuit of claim 1, further comprising:

an input stage configured to generate a control signal based on a comparison of an input signal and a reference signal;

wherein the input stage comprises a differential pair of transistors and a current mirror load configured to:

(i) convert a differential output of the input stage to a single-ended current corresponding to the first portion of the current; and (ii) generate a control node that drives the second path through a filter element.

12. The circuit of claim 8, wherein:

the first path is configured to generate, based on a third signal, the first portion of the current;

the second path is configured to generate, based on the third signal, the second portion of the current; and the circuit further comprises an input stage configured to generate, based on the second signal, the third signal.

13. The circuit of claim 12, wherein the current is a first current, the third signal is a second current, and the current generator comprises a current mirror configured to:

generate, based on the second current, using the first path, a first portion of the first current; and generate, based on the second current, using the second path, a second portion of the first current.

14. The circuit of claim 12, wherein the input stage is configured to generate, based on a comparison of the second signal and a fourth signal, the third signal.

15. The circuit of claim 8, further comprising a detector circuit configured to generate, based on a comparison of the first signal and a third signal, the second signal.

16. The circuit of claim 14, wherein:

the circuit has a loop bandwidth;

the first path has a pole at a pole frequency; and the loop bandwidth is greater than the pole frequency.

* * * * *